United States Patent
Sakai

(10) Patent No.: US 12,279,419 B2
(45) Date of Patent: Apr. 15, 2025

(54) SEMICONDUCTOR STORAGE DEVICE HAVING ROM CELLS INCLUDING NANOSHEET FIELD EFFECT TRANSISTORS

(71) Applicant: Socionext Inc., Kanagawa (JP)

(72) Inventor: Yasumitsu Sakai, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 420 days.

(21) Appl. No.: 17/842,473

(22) Filed: Jun. 16, 2022

(65) Prior Publication Data

US 2022/0310634 A1    Sep. 29, 2022

Related U.S. Application Data

(63) Continuation of application No. PCT/JP2020/046574, filed on Dec. 14, 2020.

(30) Foreign Application Priority Data

Dec. 20, 2019    (JP) ................................. 2019-230713

(51) Int. Cl.
*H10B 20/00* (2023.01)
*H01L 29/06* (2006.01)
*H01L 29/423* (2006.01)
*H01L 29/786* (2006.01)

(52) U.S. Cl.
CPC ......... *H10B 20/34* (2023.02); *H01L 29/0665* (2013.01); *H01L 29/42392* (2013.01); *H01L 29/78696* (2013.01)

(58) Field of Classification Search
CPC ................ H10B 20/34; H01L 29/0665; H01L 29/42392; H01L 29/78696
See application file for complete search history.

(56) References Cited

U.S. PATENT DOCUMENTS

| 2016/0329313 | A1 | 11/2016 | Kawa et al. |
| 2018/0233508 | A1 | 8/2018 | Hsieh |
| 2019/0043587 | A1* | 2/2019 | Lu .............................. G11C 7/02 |

(Continued)

FOREIGN PATENT DOCUMENTS

| WO | 2019/116827 A1 | 6/2019 |
| WO | 2019/220983 A1 | 11/2019 |

OTHER PUBLICATIONS

International Search Report (ISR) dated Mar. 9, 2021 issued in International Patent Application No. PCT/JP2020/046574 with English translation.

(Continued)

*Primary Examiner* — Michael Jung
(74) *Attorney, Agent, or Firm* — Rimon P.C.

(57) ABSTRACT

In a semiconductor storage device, a first ROM cell includes a first nanosheet FET having a first nanosheet as the channel region, provided between a first bit line and a first ground power supply line. A second ROM cell includes a second nanosheet FET having a second nanosheet as the channel region, provided between a second bit line and a second ground power supply line. The face of the first nanosheet closer to the second nanosheet in the X direction is exposed from a first gate interconnect, and the face of the second nanosheet closer to the first nanosheet in the X direction is exposed from a second gate interconnect.

15 Claims, 19 Drawing Sheets

(56) References Cited

U.S. PATENT DOCUMENTS

2019/0371802 A1* 12/2019 Morris ................. G11C 11/2275
2020/0303375 A1*  9/2020 Fukuzaki .............. H01L 29/775
2021/0074713 A1   3/2021 Moriwaki
2021/0151438 A1*  5/2021 Gomes .................. H10B 12/30

OTHER PUBLICATIONS

Written Opinion dated Mar. 9, 2021 issued in International Patent Application No. PCT/JP2020/046574 with partial English translation.

P. Weckx et al., "Stacked nanosheet fork architecture for SRAM design and device co-optimization toward 3nm", 2017 IEEE International Electron Devices Meeting (IEDM), Dec. 2017, IEDM17-505.

P. Weckx et al., "Novel forksheet device architecture as ultimate logic scaling device towards 2nm", 2019 IEEE International Electron Devices Meeting (IEDM), Dec. 2019, IEDM19-871~874.

* cited by examiner

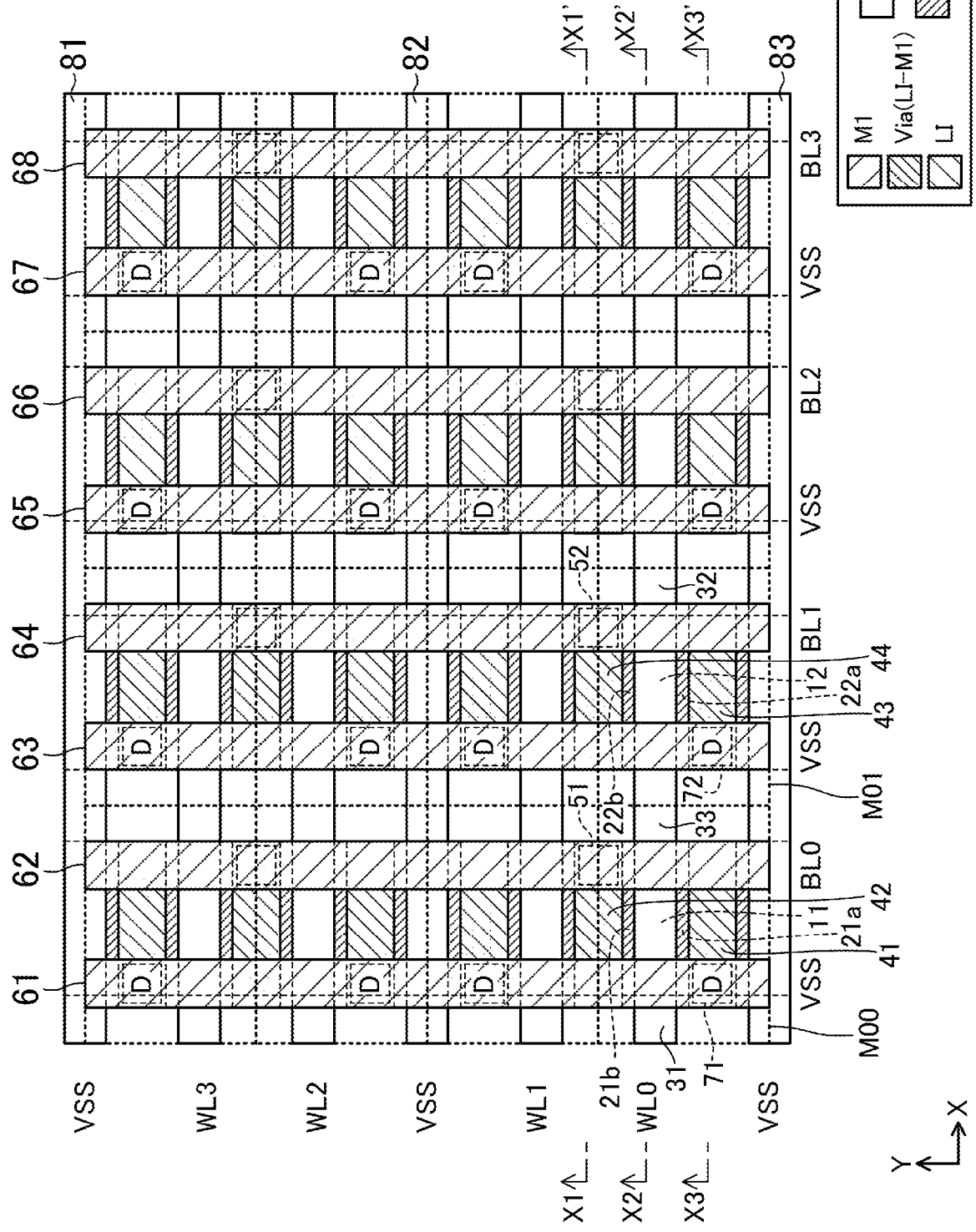

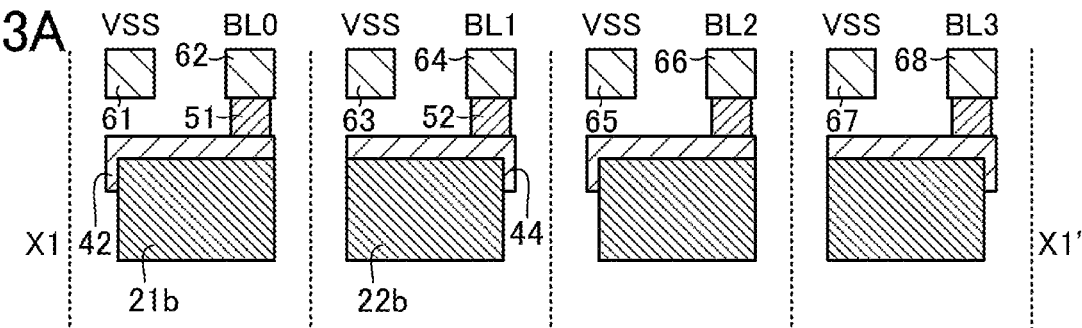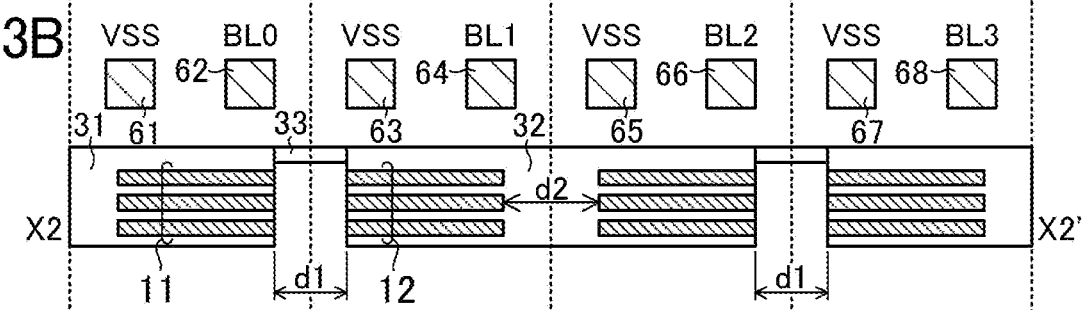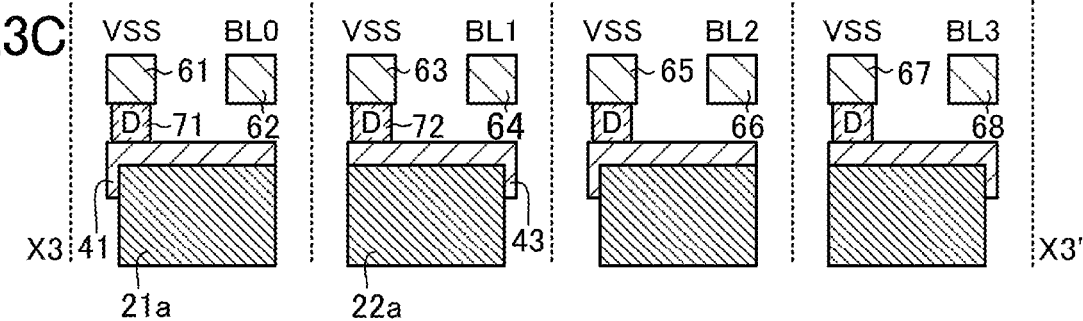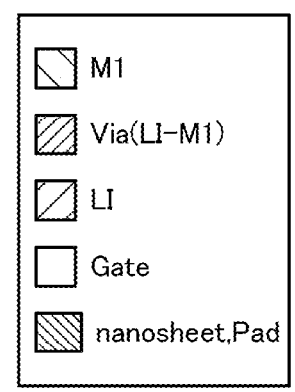

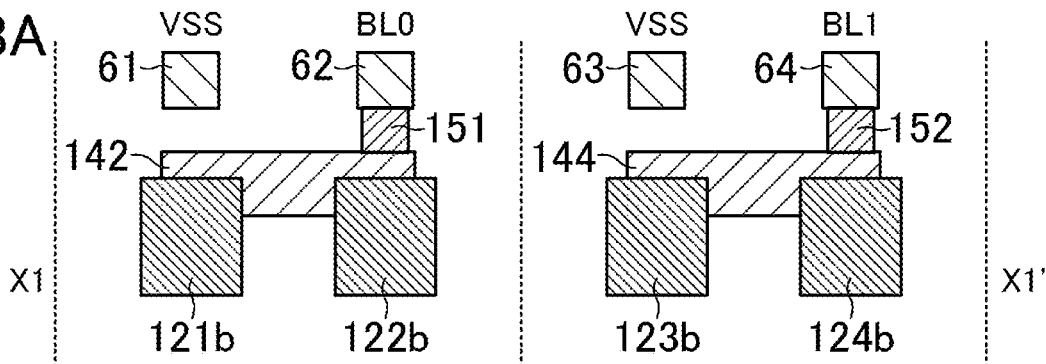
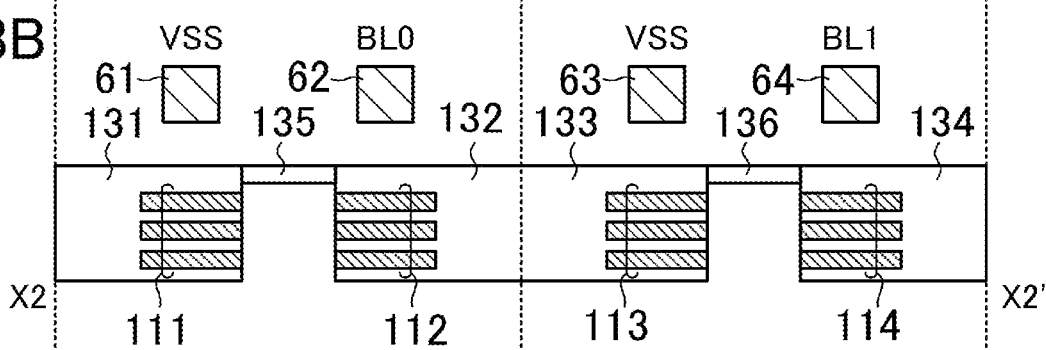
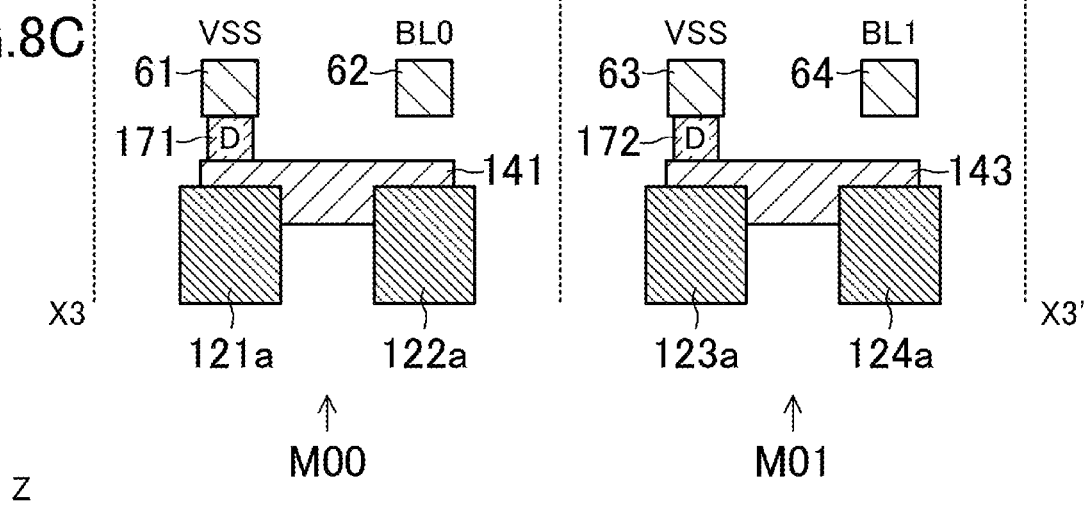
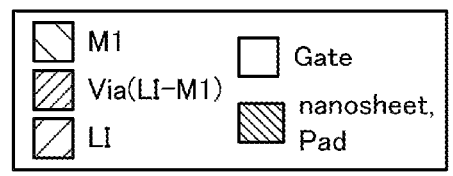

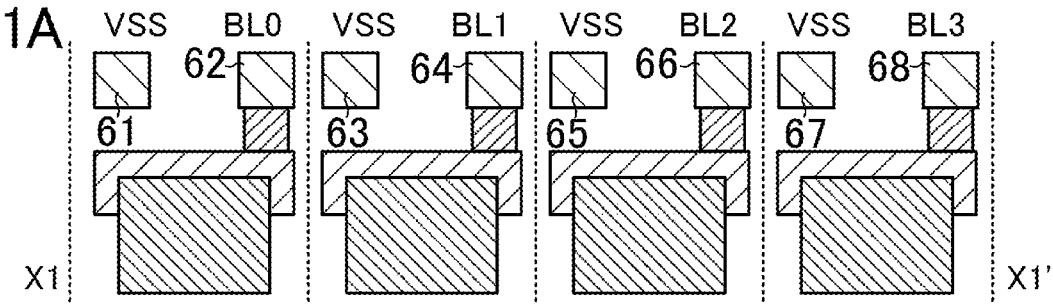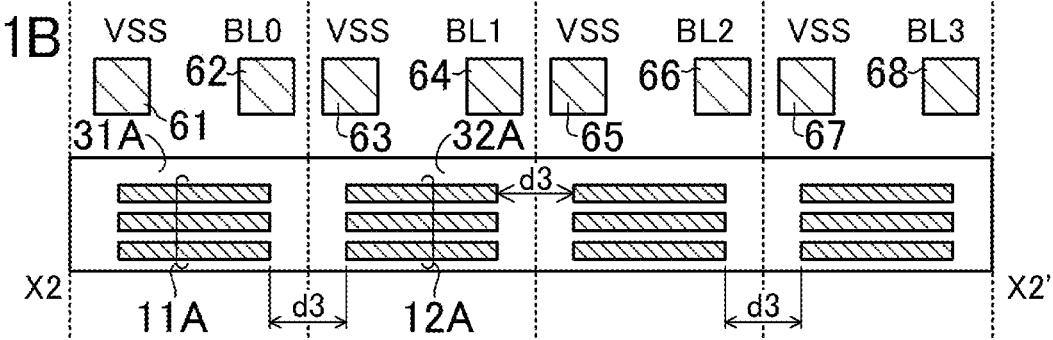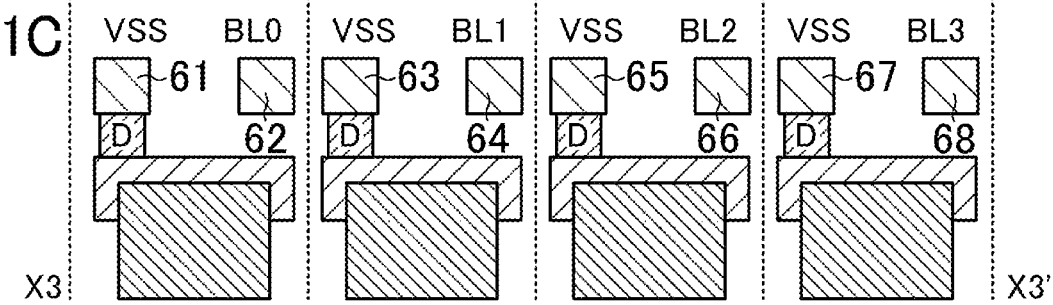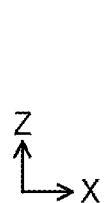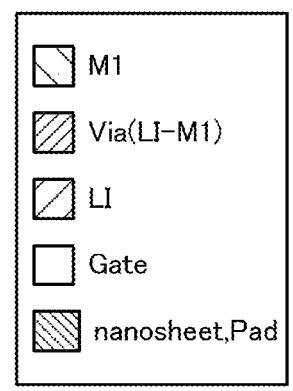

FIG.19A
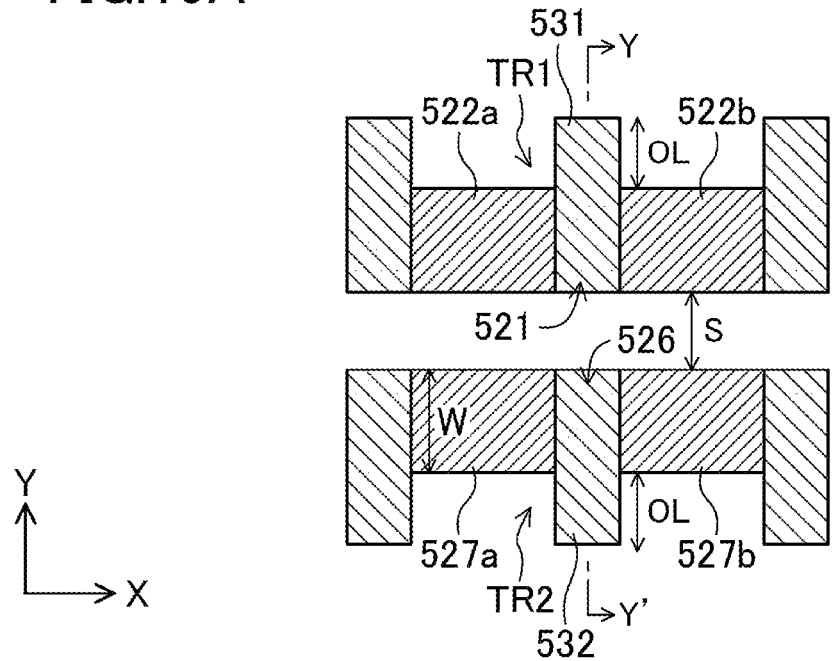
FIG.19B
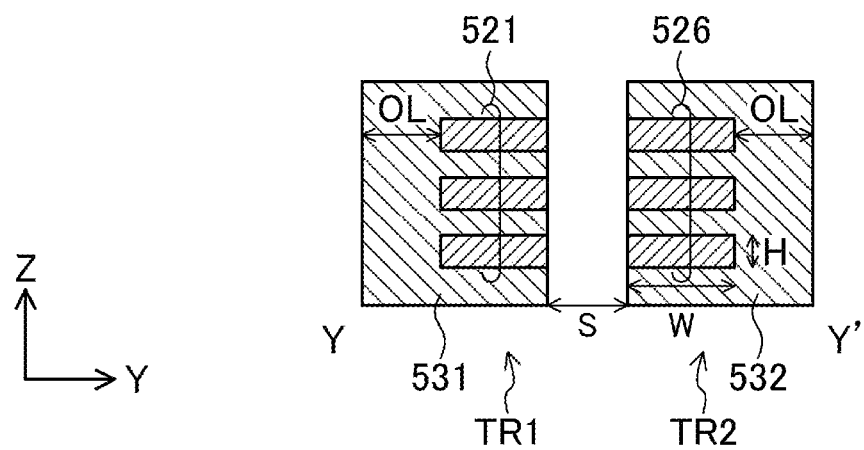
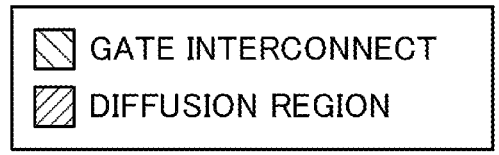

SEMICONDUCTOR STORAGE DEVICE HAVING ROM CELLS INCLUDING NANOSHEET FIELD EFFECT TRANSISTORS

CROSS-REFERENCE TO RELATED APPLICATIONS

This is a continuation of International Application No. PCT/JP2020/046574 filed on Dec. 14, 2020, which claims priority to Japanese Patent Application No. 2019-230713 filed on Dec. 20, 2019. The entire disclosures of these applications are incorporated by reference herein.

BACKGROUND

The present disclosure relates to a semiconductor storage device provided with nanosheet (nanowire) field effect transistors (FETs), and more particularly to a layout structure of a mask read only memory (ROM) using nanosheet FETs.

A mask ROM includes memory cells arranged in an array, and the memory cells are programmed to have their fixed data states during manufacture. A transistor constituting a memory cell is provided between a bit line and VSS and connected with a word line at its gate. Bit data "1" or "0" is stored in the memory cell depending on the presence or absence of connection between the source or the drain and the bit line or VSS. The presence or absence of connection is realized by the presence or absence of a contact or a via, for example.

As for transistors as basic constituents of an LSI, improvement in integration degree, reduction in operating voltage, and improvement in operating speed have been achieved thanks to scaling of the gate length. Recently, however, increase in off current due to excessive scaling and the resulting significant increase in power consumption have raised a problem. To solve this problem, three-dimensional transistors having a three-dimensional structure, changed from the conventional planar structure, have been vigorously studied. As one type of such three-dimensional transistors, nanosheet (nanowire) FETs have received attention.

P. Weckx et al., "Stacked nanosheet fork architecture for SRAM design and device co-optimization toward 3 nm," 2017 IEEE International Electron Devices Meeting (IEDM), December 2017, IEDM17-505-508 (Document 1) and P. Weckx et al., "Novel forksheet device architecture as ultimate logic scaling device towards 2 nm," 2019 IEEE International Electron Devices Meeting (IEDM), December 2019, IEDM19-871-874 (Document 2) disclose layouts of an SRAM cell using a nanosheet FET having a gate electrode shaped like a fork.

Note that the nanosheet FET having a fork-shaped gate electrode is hereinafter called a forksheet FET following the cited Document 1.

Thus far, no examination has been made on the layout structure of a mask ROM using nanosheet FETs and forksheet FETs.

An objective of the present disclosure is providing a layout structure of a mask ROM using nanosheet FETs and forksheet FETs.

SUMMARY

According to the first mode of the present disclosure, a semiconductor storage device including first and second read only memory (ROM) cells adjacent to each other in a first direction, includes: a word line extending in the first direction; first and second bit lines extending in a second direction perpendicular to the first direction; and first and second ground power supply lines extending in the second direction, wherein the first ROM cell includes a first nanosheet field effect transistor (FET) having a first nanosheet as a channel region, provided between the first bit line and the first ground power supply line, the second ROM cell includes a second nanosheet FET having a second nanosheet as a channel region, provided between the second bit line and the second ground power supply line, the word line includes a first gate interconnect surrounding peripheries of the first nanosheet in the first direction and a third direction perpendicular to the first and second directions and a second gate interconnect surrounding peripheries of the second nanosheet in the first direction and the third direction, the first ROM cell stores first data depending on a connection relationship of nodes of the first nanosheet FET with the first bit line and the first ground power supply line, and the second ROM cell stores second data depending on a connection relationship of nodes of the second nanosheet FET with the second bit line and the second ground power supply line, and the first and second nanosheets are opposed to each other in the first direction, a face of the first nanosheet closer to the second nanosheet in the first direction is exposed from the first gate interconnect, and a face of the second nanosheet closer to the first nanosheet in the first direction is exposed from the second gate interconnect.

With the above mode, the semiconductor storage device includes first and second ROM cells adjacent to each other in the first direction. The first ROM cell includes a first nanosheet FET having a first nanosheet as the channel region, provided between a first bit line and a first ground power supply line. The second ROM cell includes a second nanosheet FET having a second nanosheet as the channel region, provided between a second bit line and a second ground power supply line. The first and second nanosheets are opposed to each other in the first direction, the face of the first nanosheet closer to the second nanosheet in the first direction is exposed from the first gate interconnect, and the face of the second nanosheet closer to the first nanosheet in the first direction is exposed from the second gate interconnect. This can reduce the distance between the first nanosheet and the second nanosheet, thereby permitting reduction in the area of the semiconductor storage device.

According to the second mode of the present disclosure, a semiconductor storage device including a read only memory (ROM) cell, includes: a word line extending in a first direction; a bit line extending in a second direction perpendicular to the first direction; and a ground power supply line extending in the second direction, wherein the ROM cell includes a first nanosheet FET having a first nanosheet as a channel region, provided between the bit line and the ground power supply line, and a second nanosheet FET having a second nanosheet as a channel region, provided between the bit line and the ground power supply line, the first and second nanosheet FETs are adjacent to each other in the first direction, their drains being mutually connected and their sources being mutually connected, the word line includes a first gate interconnect surrounding peripheries of the first nanosheet in the first direction and a third direction perpendicular to the first and second directions and a second gate interconnect surrounding peripheries of the second nanosheet in the first direction and the third direction, the ROM cell stores data depending on a connection relationship of nodes of the first and second nanosheet FETs with the bit line and the ground power supply line, and the first and second nanosheets are opposed to each other in the first direction, a face of the first nanosheet closer to the second nanosheet in the first direction is exposed from the first gate interconnect, and a face of the second nanosheet closer to the first nanosheet in the first direction is exposed from the second gate interconnect.

With the above mode, the semiconductor storage device includes a ROM cell. The ROM cell includes a first nanosheet FET having a first nanosheet as the channel region, provided between a bit line and a ground power supply line, and a second nanosheet FET having a second nanosheet as the channel region, provided between the bit line and the ground power supply line. The first and second nanosheets are adjacent to each other in the first direction. The first and second nanosheets are opposed to each other in the first direction, the face of the first nanosheet closer to the second nanosheet in the first direction is exposed from the first gate interconnect, and the face of the second nanosheet closer to the first nanosheet in the first direction is exposed from the second gate interconnect. This can reduce the spacing between the first nanosheet and the second nanosheet, and thus reduce the size of the ROM cell in the first direction, thereby permitting reduction in the area of the semiconductor storage device.

According to the third mode of the present disclosure, a semiconductor storage device including first and second read only memory (ROM) cells adjacent to each other in a first direction, includes: a word line extending in the first direction; first and second bit lines extending in a second direction perpendicular to the first direction; and a plurality of ground power supply lines including first and second ground power supply lines extending in the second direction, wherein the first ROM cell includes a first nanosheet FET having a first nanosheet as a channel region, provided between the first bit line and the first ground power supply line, the second ROM cell includes a second nanosheet FET having a second nanosheet as a channel region, provided between the second bit line and the second ground power supply line, the word line includes a first gate interconnect surrounding peripheries of the first nanosheet in the first direction and a third direction perpendicular to the first and second directions and a second gate interconnect surrounding peripheries of the second nanosheet in the first direction and the third direction, the first ROM cell stores first data depending on a connection relationship of nodes of the first nanosheet FET with the first bit line and the first ground power supply line, and the second ROM cell stores second data depending on a connection relationship of nodes of the second nanosheet FET with the second bit line and the second ground power supply line, a distance between the first bit line and a ground power supply line adjacent on a first-hand side of the first bit line in the first direction is equal to a distance between the second bit line and a ground power supply line adjacent on the first-hand side of the second bit line in the first direction, and a distance between the first bit line and a ground power supply line adjacent on a second-hand side, opposite to the first-hand side, of the first bit line in the first direction is equal to a distance between the second bit line and a ground power supply line adjacent on the second-hand side of the second bit line in the first direction.

With the above mode, the semiconductor storage device includes first and second ROM cells adjacent to each other in the first direction. The first ROM cell includes a first nanosheet FET having a first nanosheet as the channel region, provided between a first bit line and a first ground power supply line. The second ROM cell includes a second nanosheet FET having a second nanosheet as the channel region, provided between a second bit line and a second ground power supply line. The distances from the first bit line to its adjacent ground power supply lines on both sides are respectively equal to the distances from the second bit line to its adjacent ground power supply lines on both sides. This makes uniform the load capacitance due to wiring capacitance related to the first and second bit lines, and thus prevents or reduces variations in performance, such as the operating speed, between the first and second bit lines.

According to the present disclosure, a small-area layout structure can be implemented for a semiconductor storage device using nanosheet FETs and forksheet FETs.

BRIEF DESCRIPTION OF THE DRAWINGS

FIG. 2 is a plan view showing an example of the layout structure of a semiconductor storage device according to the first embodiment.

FIGS. 3A-3C are cross-sectional views of the layout structure of FIG. 2.

FIGS. 8A-8C are cross-sectional views of the layout structure of FIG. 7.

FIGS. 11A-11C are cross-sectional views of the layout structure of FIG. 10.

FIGS. 19A-19B are views showing a basic structure of a forksheet FET, where FIG. 19A is a plan view and FIG. 19B is a cross-sectional view.

DETAILED DESCRIPTION

Figure 1:
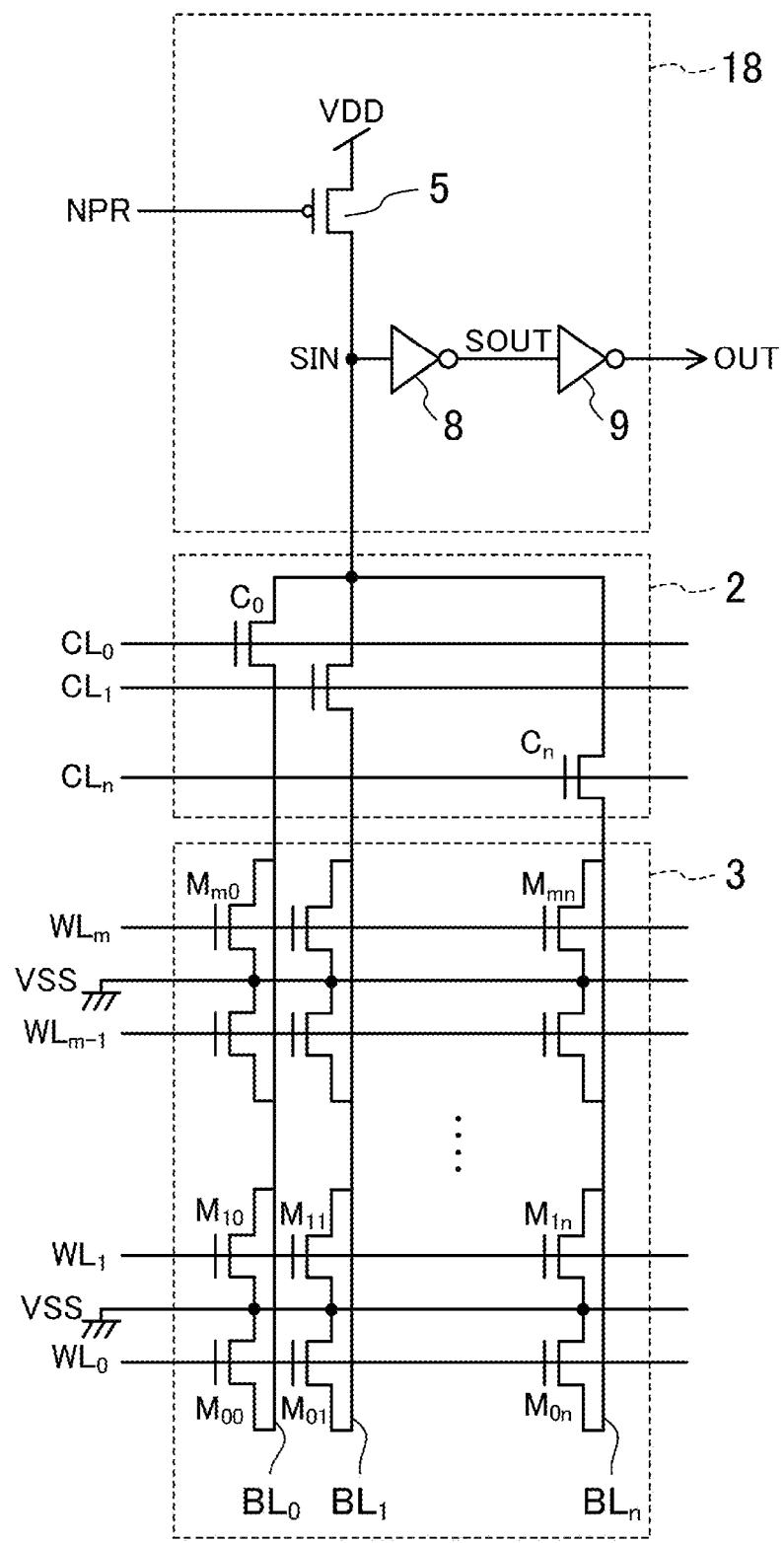
FIG. 1 is a circuit diagram showing a configuration of a contact-type mask ROM as an example of semiconductor storage devices.

Embodiments of the present disclosure will be described hereinafter with reference to the accompanying drawings. In the following embodiments, it is assumed that the semiconductor storage device includes nanosheet field effect transistors (FETs). The nanosheet FET is a FET using a thin sheet (nanosheet) through which a current flows. Such a nanosheet is formed of silicon, for example. In the semiconductor storage device, it is assumed that some of the nanosheet FETs are forksheet FETs having a fork-shaped gate electrode. In the present disclosure, also, a semiconductor layer portion formed on each end of a nanosheet to constitute a terminal that is to be the source or drain of a nanosheet FET is called a "pad."

First, the basic structure of a forksheet FET will be described.

FIGS. 19A-19B are views showing the basic structure of a forksheet FET, where FIG. 19A is a plan view and FIG. 19B is a cross-sectional view taken along line Y-Y' in FIG. 19A. In the basic structure of FIGS. 19A-19B, two transistors TR1 and TR2 are placed side by side with space S between them in the Y direction. A gate interconnect 531 that is to be the gate of the transistor TR1 and a gate interconnect 532 that is to be the gate of the transistor TR2 extend in the Y direction and are at the same position in the X direction.

A channel portion 521 that is to be the channel region of the transistor TR1 and a channel portion 526 that is to be the channel region of the transistor TR2 are constituted by nanosheets. In FIGS. 19A-19B, the channel portions 521 and 526 are each constituted by a stacked structure of three nanosheets overlapping one another as viewed in plan. Pads 522a and 522b that are to be the source and drain regions of the transistor TR1 are formed on both sides of the channel portion 521 in the X direction. Pads 527a and 527b that are to be the source and drain regions of the transistor TR2 are formed on both sides of the channel portion 526 in the X direction. The pads 522a and 522b are formed by epitaxial growth from the nanosheets constituting the channel portion 521. The pads 527a and 527b are formed by epitaxial growth from the nanosheets constituting the channel portion 526.

The gate interconnect 531 surrounds the peripheries of the nanosheets constituting the channel portion 521 in the Y and Z directions via a gate insulating film (not shown). Note however that the faces of the nanosheets constituting the channel portion 521 on the side closer to the transistor TR2 in the Y direction are exposed, not covered with the gate interconnect 531. That is, in the cross-sectional view of FIG. 19B, the gate interconnect 531 does not cover the right side faces of the nanosheets constituting the channel portion 521 but covers the upper, lower, and left side faces of the nanosheets. The gate interconnect 531 protrudes from the nanosheets constituting the channel portion 521 by a length OL toward the side away from the transistor TR2 in the Y direction.

The gate interconnect 532 surrounds the peripheries of the nanosheets constituting the channel portion 526 in the Y and Z directions via a gate insulating film (not shown). Note however that the faces of the nanosheets constituting the channel portion 526 on the side closer to the transistor TR1 in the Y direction are exposed, not covered with the gate interconnect 532. That is, in the cross-sectional view of FIG. 19B, the gate interconnect 532 does not cover the left side faces of the nanosheets constituting the channel portion 526 but covers the upper, lower, and right side faces of the nanosheets. The gate interconnect 532 protrudes from the nanosheets constituting the channel portion 526 by a length OL toward the side away from the transistor TR1 in the Y direction.

Here, the gate effective width Weff of each nanosheet is represented by $$W\text{eff} = 2 \times W + H$$

where W is the width (size in the Y direction) of the nanosheet, and H is the height (size in the Z direction) thereof. Since the channel portions 521 and 526 of the transistors TR1 and TR2 are each constituted by three nanosheets, the gate effective width of each of the transistors TR1 and TR2 is $$3 \times (2 \times W + H).$$

In the structure of FIGS. 19A-19B, the gate interconnect 531 does not protrude from the nanosheets constituting the channel portion 521 toward the transistor TR2 in the Y direction. Also, the gate interconnect 532 does not protrude from the nanosheets constituting the channel portion 526 toward the transistor TR1 in the Y direction. This can bring the transistors TR1 and TR2 closer to each other and thus achieve area reduction.

The number of nanosheets constituting the channel portion of each transistor is not limited to three. The channel portion may be constituted by one nanosheet, or may be constituted by a stacked structure of a plurality of nanosheets. Also, while the cross-sectional shape of the nanosheets is illustrated as rectangular in FIG. 19B, it is not limited to this. For example, the shape may be square, circular, or oval.

The semiconductor storage device may include both forksheet FETs and nanosheet FETs where the entire peripheries of nanosheets are surrounded by a gate interconnect, in a mixed manner.

As used herein, "VDD" and "VS S" refer to the power supply voltages or the power supplies themselves. Also, as used herein, an expression indicating that sizes such as widths are identical, like the "same wiring width," is to be understood as including a range of manufacturing variations.

The source region and drain region of a transistor are herein called the "nodes" of the transistor as appropriate. That is, one node of a transistor refers to the source or drain of the transistor, and both nodes of a transistor refer to the source and drain of the transistor.

First Embodiment

FIG. 1 is a circuit diagram showing a configuration of a contact-type mask ROM as an example of semiconductor storage devices. The contact-type mask ROM is a ROM in which whether or not the drain of a memory cell transistor is connected to a bit line through a contact is made to correspond to "0" or "1" of memory data.

In FIG. 1, the mask ROM includes a memory cell array 3, a column decoder 2, and a sense amplifier 18.

The memory cell array 3 is constituted by memory cells Mij (i=0 to m, j=0 to n) of n-type MOS transistors arranged in a matrix. The gates of the memory cells Mij are connected to corresponding word lines WLi that are common for each row, and the sources thereof are connected to the ground potential VS S. The drains of the memory cells Mij are connected to corresponding bit lines BLj when the memory data is intended to be "0," and are not connected to the bit lines BLj when it is intended to be "1."

The column decoder 2 is constituted by n-type MOS transistors Cj. The drains of the n-type MOS transistors Cj are all connected together as a common drain, the gates thereof are connected to corresponding column selection signal lines CLj, and the sources thereof are connected to the corresponding bit lines BLj.

The sense amplifier 18 includes a precharge p-type MOS transistor 5, an inverter 8 that determines the output data of the memory cells Mij, and an inverter 9 that buffers the output signal of the inverter 8. A precharge signal NPR is input into the gate of the p-type MOS transistor 5, the power supply voltage VDD is supplied to the source thereof, and the drain thereof is connected to the common drain of the n-type MOS transistors Cj. The inverter 8, receiving a signal SIN of the common drain of the n-type MOS transistors Cj, determines the output data of the memory cells Mij. The inverter 9, receiving an output signal SOUT of the inverter 8, outputs memory data of the memory cells Mij.

The operation of the mask ROM of FIG. 1 will be described taking as an example the case of reading data of the memory cell M00.

First, among the column selection signal lines CLj, CL0 is made high and the other CL1 to CLn are made low. This turns on the transistor C0, among the transistors constituting the column decoder 2, and turns off the other transistors C1 to Cn. Also, a word line WL0 is changed from a low level as the non-selected state to a high level as the selected state.

The precharge signal NPR is then changed from high to low, to turn on the precharge p-type MOS transistor 5.

In the case when the drain of the memory cell M00 is connected to a bit line BL0, since the current capability of the memory cell M00 is greater than that of the precharge p-type MOS transistor 5, the input signal SIN of the inverter 8 becomes lower in voltage than the switching level of the inverter 8. Therefore, the output signal SOUT of the inverter 8 keeps high, and an output signal OUT of the inverter 9 keeps low.

On the other hand, in the case when the drain of the memory cell M00 is not connected to the bit line BL0, the bit line BL0 is charged by the precharge p-type MOS transistor 5, and thus the input signal SIN of the inverter 8 becomes higher in voltage than the switching level of the inverter 8. Therefore, the output signal SOUT of the inverter 8 becomes low, and the output signal OUT of the inverter 9 becomes high.

That is, when the drain of a memory cell is connected to a bit line, a low level is output (memory data "0"), and when the drain of a memory cell is not connected to a bit line, a high level is output (memory data "1").

Note that, in the mask ROM according to this disclosure, as the method of storing a value in each memory cell, there are a case of setting the value by connection or disconnection between the memory cell and a bit line and a case of setting the value by connection or disconnection between the memory cell and VSS.

FIGS. 2 and 3A-3C are views showing an example of the layout structure of a mask ROM according to the first embodiment. Specifically, FIG. 2 is a plan view of a memory cell array, and FIGS. 3A-3C are cross-sectional views of the memory cell array of FIG. 2 taken horizontally as viewed in plan, where FIG. 3A shows a cross section taken along line X1-X1', FIG. 3B shows a cross section taken along line X2-X2', and FIG. 3C shows a cross section taken along line X3-X3'.

In the following description, in the plan views such as FIG. 2, the horizontal direction in the figure is called an X direction (corresponding to the first direction), the vertical direction in the figure is called a Y direction (corresponding to the second direction), and the direction perpendicular to the substrate plane is called a Z direction (corresponding to the depth direction). Note that the X direction is the direction in which gate interconnects and word lines extend and the Y direction is the channel direction and the direction in which bit lines extend.

Also, in the drawings related to the first and second embodiments, any contact determining the memory value of a memory cell is marked with the letter "D."

FIG. 2 corresponds to the layout of (4×4) bits, and the dotted lines define the bounds of the individual bits. That is, FIG. 2 shows a configuration of an array of memory cells, four arranged in the X direction and four in the Y direction. The memory cells are inverted in the Y direction every other row in the Y direction. The leftmost memory cell and the second leftmost memory cell in the lowermost row correspond to the memory cells M00 and M01, respectively, in the circuit diagram of FIG. 1, for example. Taking these memory cells M00 and M01, the structure of memory cells will be described hereinafter.

As shown in FIG. 2, interconnects 61 to 68 extending in the Y direction are formed in an M1 interconnect layer. The M1 interconnects 62, 64, 66, and 68 correspond to bit lines BL0, BL1, BL2, and BL3, respectively, and the M1 interconnects 61, 63, 65, and 67 supply VSS.

The memory cells M00 and M01 have nanosheets 11 and 12, respectively, each composed of three sheets, as the channel portions. That is, the memory cells M00 and M01 each include a nanosheet FET.

In FIG. 2, pads 21a and 22a, each of which is a semiconductor layer of integral structure connected to the three sheets, are formed on the lower sides of the nanosheets 11 and 12, respectively, in the figure. Pads 21b and 22b, each of which is a semiconductor layer of integral structure connected to the three sheets, are formed on the upper sides of the nanosheets 11 and 12, respectively, in the figure. The pads 21a and 21b are to be the nodes of the memory cell M00, and the pads 22a and 22b are to be the nodes of the memory cell M01.

Gate interconnects 31 and 32 extending in the X direction are formed. The gate interconnect 31 surrounds the peripheries of the nanosheets 11 of the memory cell M00 in the X and Z directions via a gate insulating film (not shown). The gate interconnect 31 is to be the gate of the memory cell M00. The gate interconnect 32 surrounds the peripheries of the nanosheets 12 of the memory cell M01 in the X and Z directions via a gate insulating film (not shown). The gate interconnect 32 is to be the gate of the memory cell M01. The gate interconnects 31 and 32 are connected with other gate interconnects arranged in line in the X direction, to constitute a word line WL0. That is, word lines WL0 to WL3 each include gate interconnects arranged in line in the X direction.

Local interconnects 41, 42, 43, and 44 extending in the X direction are formed. The local interconnect 41 is connected with the pad 21a, and the local interconnect 42 is connected with the pad 21b. The local interconnect 43 is connected with the pad 22a, and the local interconnect 44 is connected with the pad 22b. The local interconnect 42 is connected with the M1 interconnect 62 through a contact 51, and the local interconnect 44 is connected with the M1 interconnect 64 through a contact 52.

Contacts 71 and 72 determine the memory values of the memory cells by their presence or absence. The contact 71 connects the local interconnect 41 and the M1 interconnect 61 supplying VSS when it is formed, and the contact 72 connects the local interconnect 43 and the M1 interconnect 63 supplying VSS when it is formed.

In FIG. 2, the word lines WL0 to WL3 extend in the X direction, and are each constituted by gate interconnects arranged in line in the X direction as described above. Between the word lines WL0 and WL1, the drains are shared by the adjacent transistors, and between the word lines WL2 and WL3, the drains are shared by the adjacent transistors. Dummy gate interconnects 81, 82 and 83 that supply VSS are formed to extend in the X direction.

Note here that the faces of the nanosheets 11 on the side closer to the nanosheets 12 in the X direction are exposed, not covered with the gate interconnect 31. Also, the faces of the nanosheets 12 on the side closer to the nanosheets 11 in the X direction are exposed, not covered with the gate interconnect 32. That is, the memory cells M00 and M01 each include a forksheet FET. Note that the gate interconnects 31 and 32 are mutually connected through a bridge 33 formed between the gate interconnects 31 and 32. The bridge 33 is an example of the gate connecting unit.

With the above configuration, since the space required between the nanosheets 11 and 12 is reduced, a distance d1 between the nanosheets 11 and 12 can be reduced (d1<d2). It is therefore possible to achieve reduction in the area of the semiconductor storage device having forksheet FETs.

As described above, in this embodiment, the semiconductor storage device includes the ROM cells M00 and M01 adjacent to each other in the X direction. The ROM cell M00, provided between the bit line 62 and the ground power supply line 61, includes a nanosheet FET having the nanosheets 11 as the channel region. The ROM cell M01, provided between the bit line 64 and the ground power supply line 63, includes a nanosheet FET having the nanosheets 12 as the channel region. The nanosheets 11 and 12 are opposed to each other in the X direction, where the faces of the nanosheets 11 closer to the nanosheets 12 are exposed from the gate interconnect 31, and the faces of the nanosheets 12 closer to the nanosheets 11 are exposed from the gate interconnect 32. This can reduce the distance between the nanosheets 11 and 12, thereby permitting reduction in the area of the semiconductor storage device.

Also, the M1 interconnects 61 to 68 extending in the Y direction are arranged at equal spacing, and the M1 interconnects 62, 64, 66, and 68 corresponding to the bit lines BL0 to BL3 are individually interposed between the M1 interconnects 61, 63, 65, and 67 supplying VSS. With the bit lines BL each interposed between VSS lines, crosstalk between the bit lines BL can be prevented, whereby occurrence of a malfunction can be prevented or reduced. Also, since the distances from a bit line BL to its adjacent VSS lines on both sides are the same among all the bit lines BL, the load capacitance due to wiring capacitance related to the bit line BL becomes uniform. This prevents or reduces variations in performance, such as the operating speed, among the bit lines BL.

It is not necessarily required to arrange the M1 interconnects 61 to 68 extending in the Y direction at equal spacing. In such a case, also, if only the distances from a bit line BL to its adjacent VSS lines on both sides are the same among all the bit lines BL, the load capacitance due to wiring capacitance related to the bit line BL will become uniform, and thus variations in performance, such as the operating speed, among the bit lines BL will be prevented or reduced. For example, even when all of the M1 interconnects 61, 63, 65, and 67 supplying VSS are displaced by a same distance in the X direction, the load capacitance due to wiring capacitance related to each bit line BL will be uniform, and thus variations in performance, such as the operating speed, among the bit lines BL will be prevented or reduced.

<Alteration 1>

Figure 4:
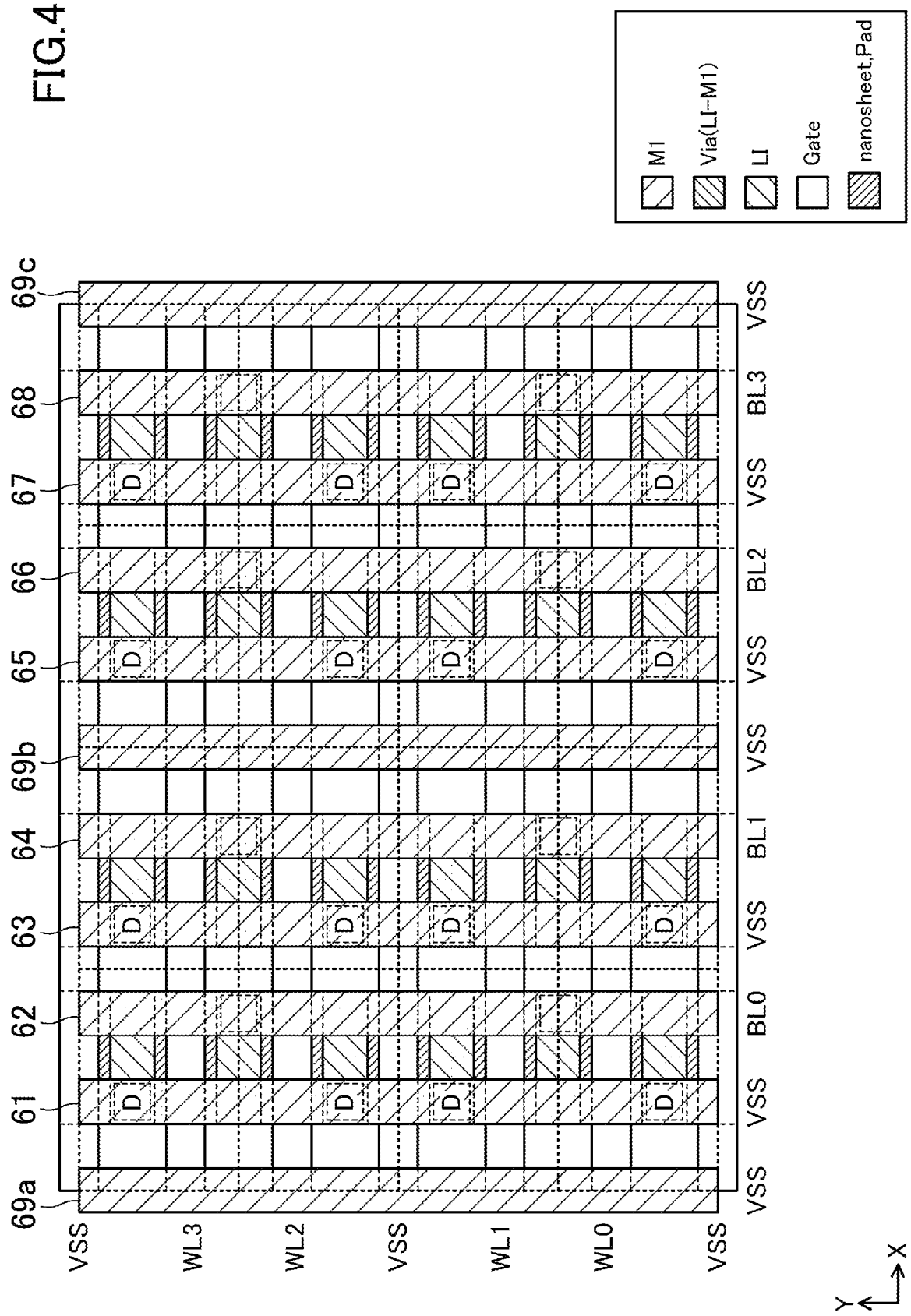
FIG. 4 is a plan view showing an example of the layout structure of a semiconductor storage device according to Alteration 1 of the first embodiment.

FIG. 4 is a plan view of a memory cell array according to Alteration 1 of the first embodiment. The layout structure of FIG. 4 is basically similar to the layout structure of FIG. 2, except that, in FIG. 4, the positions of the M1 interconnects 62, 64, 66, and 68 corresponding to the bit lines BL0 to BL3 with respect to the nanosheets are uniform. Also, the positions of the M1 interconnects 61, 63, 65, and 67 supplying VSS with respect to the nanosheets are uniform. With these changes in the positioning of the M1 interconnects 61 to 68, the positions of the contacts and the lengths of the local interconnects are different from those in FIG. 2.

In this embodiment, since forksheet FETs are used in the memory cells, a narrow inter-transistor spacing and a wide inter-transistor spacing appear alternately in the X direction. Therefore, when the bit lines BL are arranged at equal spacing, the positions of the bit lines BL with respect to the nanosheets fail to be uniform. By contrast, in this alteration, the positions of the bit lines BL with respect to the nanosheets are uniform. Therefore, the characteristics of the bit lines BL can be made uniform.

Further, in FIG. 4, M1 interconnects 69*a*, 69*b*, and 69*c* supplying VSS are additionally provided in the space produced by the uniform positioning of the bit lines BL with respect to the nanosheets. With this additional placement, since the distances from a bit line BL to its adjacent VSS lines on both sides can be made uniform for all the bit lines BL, the load capacitance related to the bit line BL can be made uniform. Note that it is not necessarily required to additionally provide the M1 interconnects 69*a*, 69*b*, and 69*c* supplying VSS.

Figure 5:
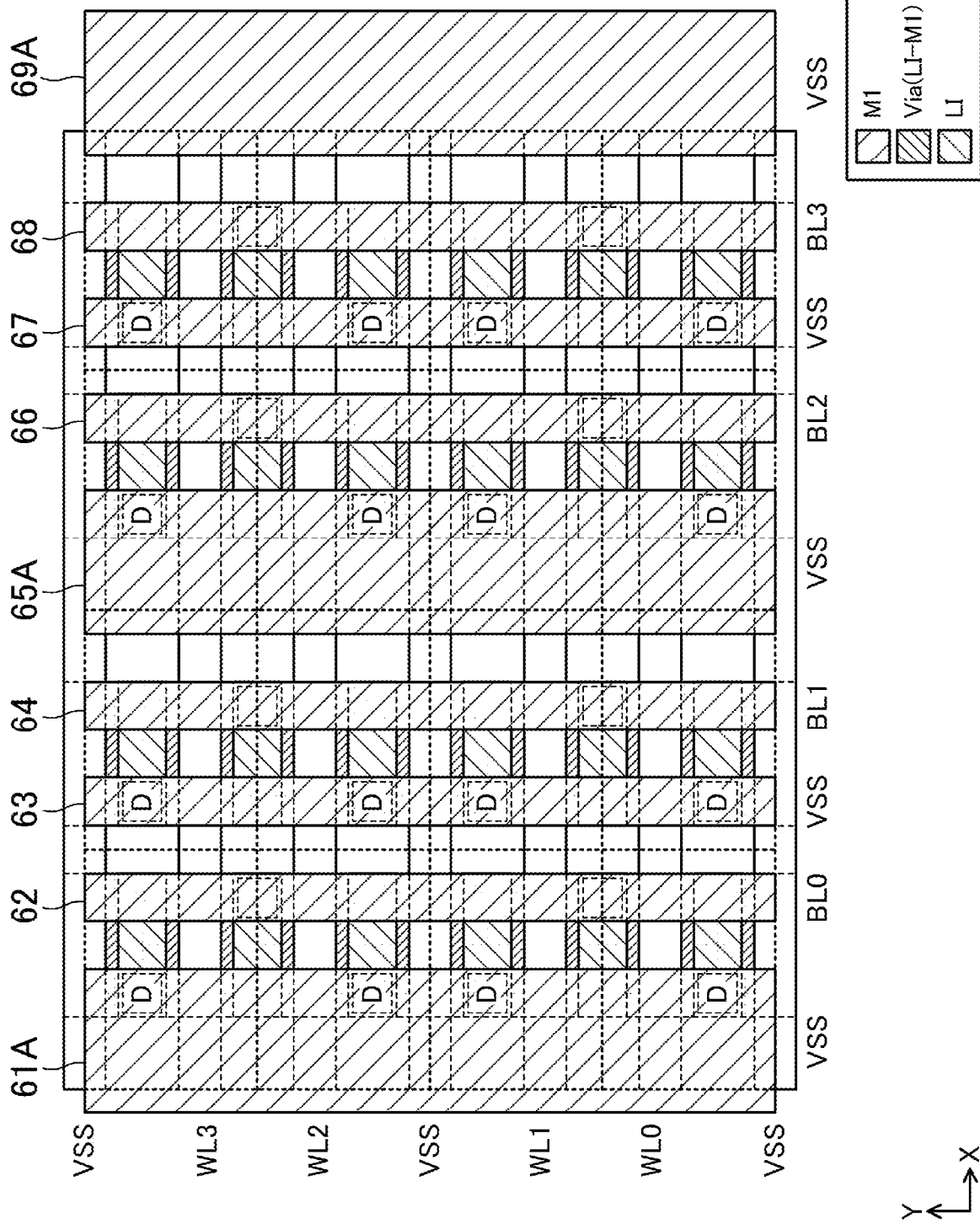
FIG. 5 is a plan view showing another example of the layout structure of the semiconductor storage device according to Alteration 1 of the first embodiment.

Also, as shown in FIG. 5, in place of additionally providing the M1 interconnects 69*a*, 69*b*, 69*c* supplying VSS, wide M1 interconnects 61A, 65A, and 69A may be provided.

<Alteration 2>

Figure 6:
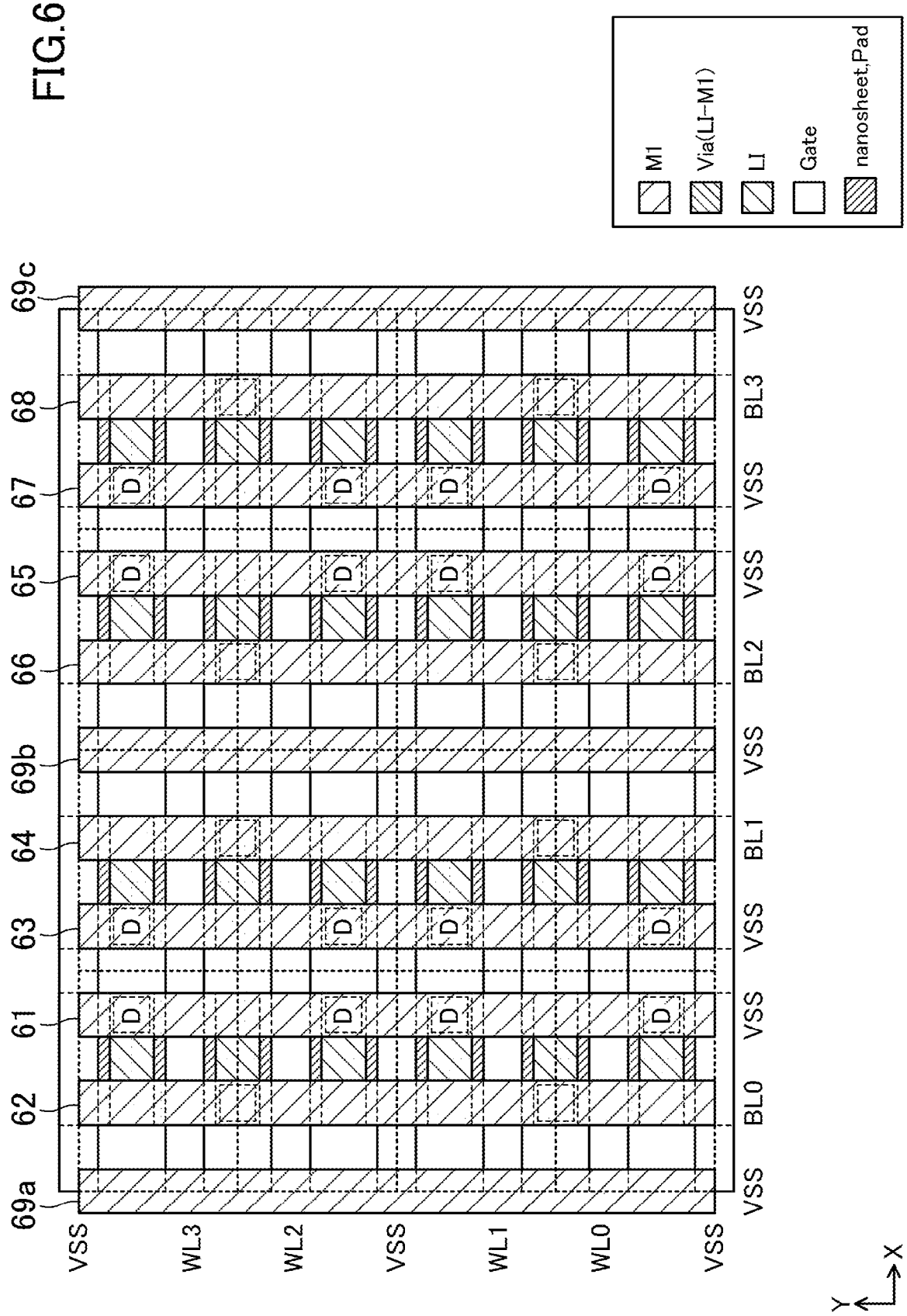
FIG. 6 is a plan view showing an example of the layout structure of a semiconductor storage device according to Alteration 2 of the first embodiment.

FIG. 6 is a plan view of a memory cell array according to Alteration 2 of the first embodiment. The layout structure of FIG. 6 is substantially similar to the layout structure of FIG. 4, except that, in FIG. 6, the positions of the M1 interconnects 61 and 62 are interchanged, and the positions of the M1 interconnects 65 and 66 are interchanged. This makes uniform the positions of the bit lines BL with respect to the exposed portions of the forksheets from the gate interconnects. That is, all of the M1 interconnects 62, 64, 66, and 68 corresponding to the bit lines BL0 to BL3 are located on the side opposite to the side on which the forksheets are exposed from the gate interconnects. This can make the characteristics of the bit lines BL further uniform.

<Alteration 3>

Figure 7:
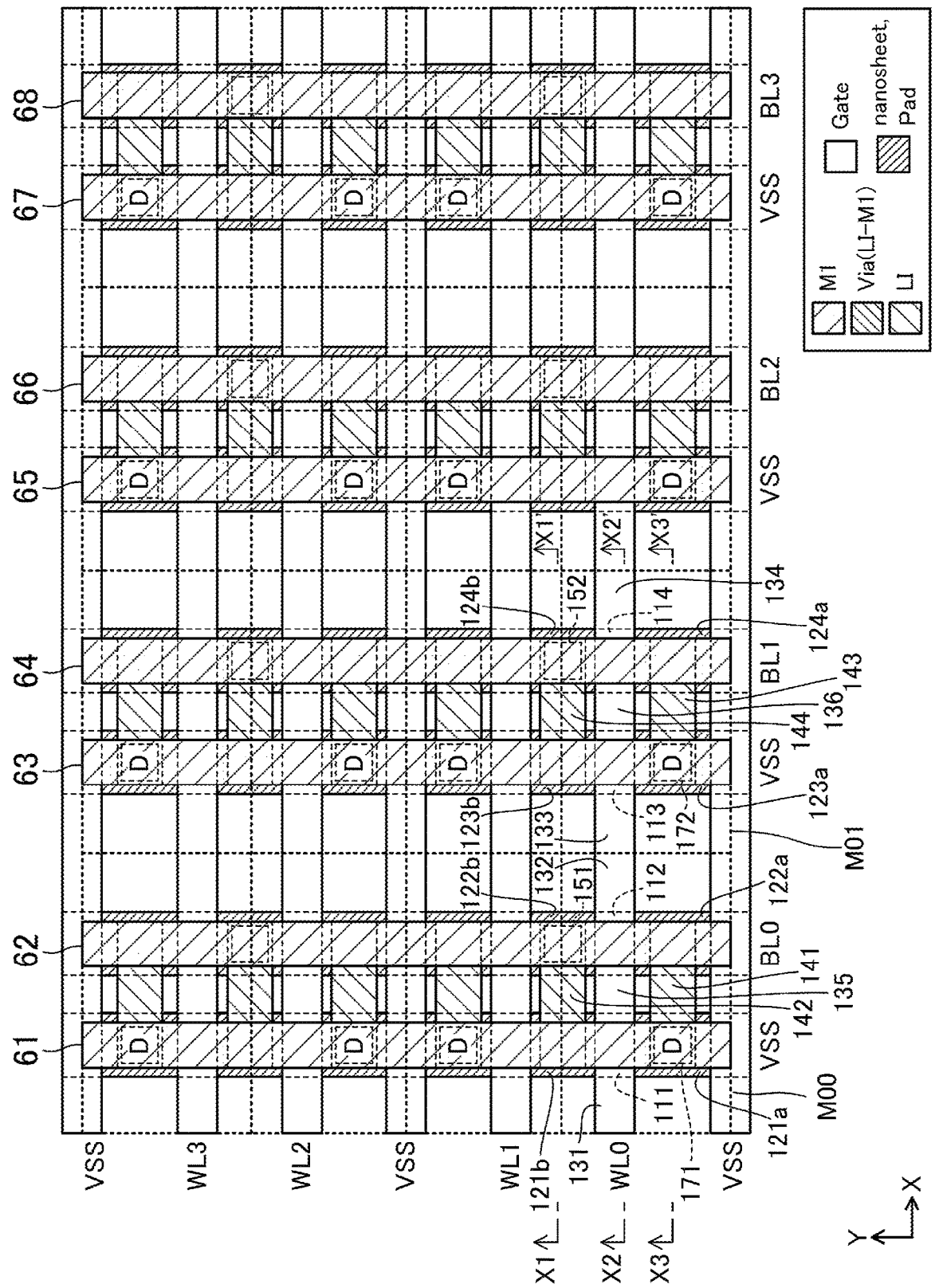
FIG. 7 is a plan view showing an example of the layout structure of a semiconductor storage device according to Alteration 3 of the first embodiment.

FIG. 7 is a plan view of a memory cell array according to Alteration 3 of the first embodiment, and FIGS. 8A-8C are cross-sectional views of the memory cell array of FIG. 7 taken horizontally as viewed in plan, where FIG. 8A shows a cross section taken along line X1-X1', FIG. 8B shows a cross section taken along line X2-X2', and FIG. 8C shows a cross section taken along line X3-X3'.

In this alteration, a memory cell of each bit includes two parallel-connected forksheet FETs arranged side by side in the X direction. The structure of memory cells will be described hereinafter taking memory cells M00 and M01 as an example.

The memory cell M00 has nanosheets 111 and 112, each composed of three sheets, as the channel portions. The memory cell M01 has nanosheets 113 and 114, each composed of three sheets, as the channel portions.

In FIG. 7, pads 121a and 122a, each of which is a semiconductor layer of integral structure connected to the three sheets, are formed on the lower sides of the nanosheets 111 and 112, respectively, in the figure. Pads 121b and 122b, each of which is a semiconductor layer of integral structure connected to the three sheets, are formed on the upper sides of the nanosheets 111 and 112, respectively, in the figure. The pads 121a, 121b, 122a, and 122b are to be the nodes of the memory cell M00. Also, pads 123a and 124a, each of which is a semiconductor layer of integral structure connected to the three sheets, are formed on the lower sides of the nanosheets 113 and 114, respectively, in the figure. Pads 123b and 124b, each of which is a semiconductor layer of integral structure connected to the three sheets, are formed on the upper sides of the nanosheets 113 and 114, respectively, in the figure. The pads 123a, 123b, 124a, and 124b are to be the nodes of the memory cell M01.

Gate interconnects 131, 132, 133, and 134 extending in the X direction are formed. The gate interconnect 131 surrounds the peripheries of the nanosheets 111 of the memory cell M00 in the X and Z directions via a gate insulating film (not shown), and the gate interconnect 132 surrounds the peripheries of the nanosheets 112 of the memory cell M00 in the X and Z directions via a gate insulating film (not shown). The gate interconnects 131 and 132 are to be the gates of the memory cell M00. Also, the gate interconnect 133 surrounds the peripheries of the nanosheets 113 of the memory cell M01 in the X and Z directions via a gate insulating film (not shown), and the gate interconnect 134 surrounds the peripheries of the nanosheets 114 of the memory cell M01 in the X and Z directions via a gate insulating film (not shown). The gate interconnects 133 and 134 are to be the gates of the memory cell M01.

Note here that the faces of the nanosheets 111 on the side closer to the nanosheets 112 in the X direction are exposed, not covered with the gate interconnect 131. The faces of the nanosheets 112 on the side closer to the nanosheets 111 in the X direction are exposed, not covered with the gate interconnect 132. The faces of the nanosheets 113 on the side closer to the nanosheets 114 in the X direction are exposed, not covered with the gate interconnect 133. The faces of the nanosheets 114 on the side closer to the nanosheets 113 in the X direction are exposed, not covered with the gate interconnect 134.

With the above configuration, since the space required between the nanosheets 111 and 112 is reduced, the distance between the nanosheets 111 and 112 can be reduced. Similarly, since the space required between the nanosheets 113 and 114 is reduced, the distance between the nanosheets 113 and 114 can be reduced.

Note that the gate interconnects 131 and 132 are mutually connected through a bridge 135 formed between the gate interconnects 131 and 132. Also, the gate interconnects 133 and 134 are mutually connected through a bridge 136 formed between the gate interconnects 133 and 134. The bridges 135 and 136 are an example of the gate connecting unit.

Local interconnects 141, 142, 143, and 144 extending in the X direction are formed. The local interconnect 141 is connected with the pads 121a and 122a, and the local interconnect 142 is connected with the pads 121b and 122b. That is, the drains of the two nanosheet FETs of the memory cell M00 are mutually connected, and the sources thereof are mutually connected. Also, the local interconnect 143 is connected with the pads 123a and 124a, and the local interconnect 144 is connected with the pads 123b and 124b. That is, the drains of the two nanosheet FETs of the memory cell M01 are mutually connected, and the sources thereof are mutually connected. The local interconnect 142 is connected with the M1 interconnect 62 through a contact 151, and the local interconnect 144 is connected with the M1 interconnect 64 through a contact 152.

Contacts 171 and 172 determine the memory values of the memory cells by their presence or absence. The contact 171 connects the local interconnect 141 and the M1 interconnect 61 supplying VSS when it is formed, and the contact 172 connects the local interconnect 143 and the M1 interconnect 63 supplying VSS when it is formed.

As described above, in this alteration, the semiconductor storage device includes the ROM cell M00. The ROM cell M00 includes: the first nanosheet FET having the nanosheets 111 as the channel region, provided between the bit line 62 and the ground power supply line 61; and the second nanosheet FET having the nanosheets 112 as the channel region, provided between the bit line 62 and the ground power supply line 61. The nanosheets 111 and 112 are opposed to each other in the X direction, where the faces of the nanosheets 111 closer to the nanosheets 112 in the X direction are exposed from the gate interconnect 131, and the faces of the nanosheets 112 closer to the nanosheets 111 in the X direction are exposed from the gate interconnect 132. This can reduce the spacing between the nanosheets 111 and 112, and thus reduce the size of the ROM cell M00 in the X direction, thereby permitting reduction in the area of the semiconductor storage device. On the other hand, since the spacing between adjacent ROM cells in the X direction can be widened, isolation of local interconnects from each other becomes easy, whereby the manufacture easiness of the semiconductor storage device improves.

With the bit lines BL each interposed between VSS lines, crosstalk between the bit lines BL can be prevented, whereby occurrence of a malfunction can be prevented or reduced. Also, since the distances from a bit line BL to its adjacent VSS lines on both sides are the same among all the bit lines BL, the load capacitance due to wiring capacitance related to the bit line BL becomes uniform. This prevents or reduces variations in performance, such as the operating speed, among the bit lines BL. Moreover, since the positions of the bit lines BL with respect to the nanosheets are uniform, the characteristics of the bit lines BL can be made uniform.

<Alteration 4>

Figure 9:
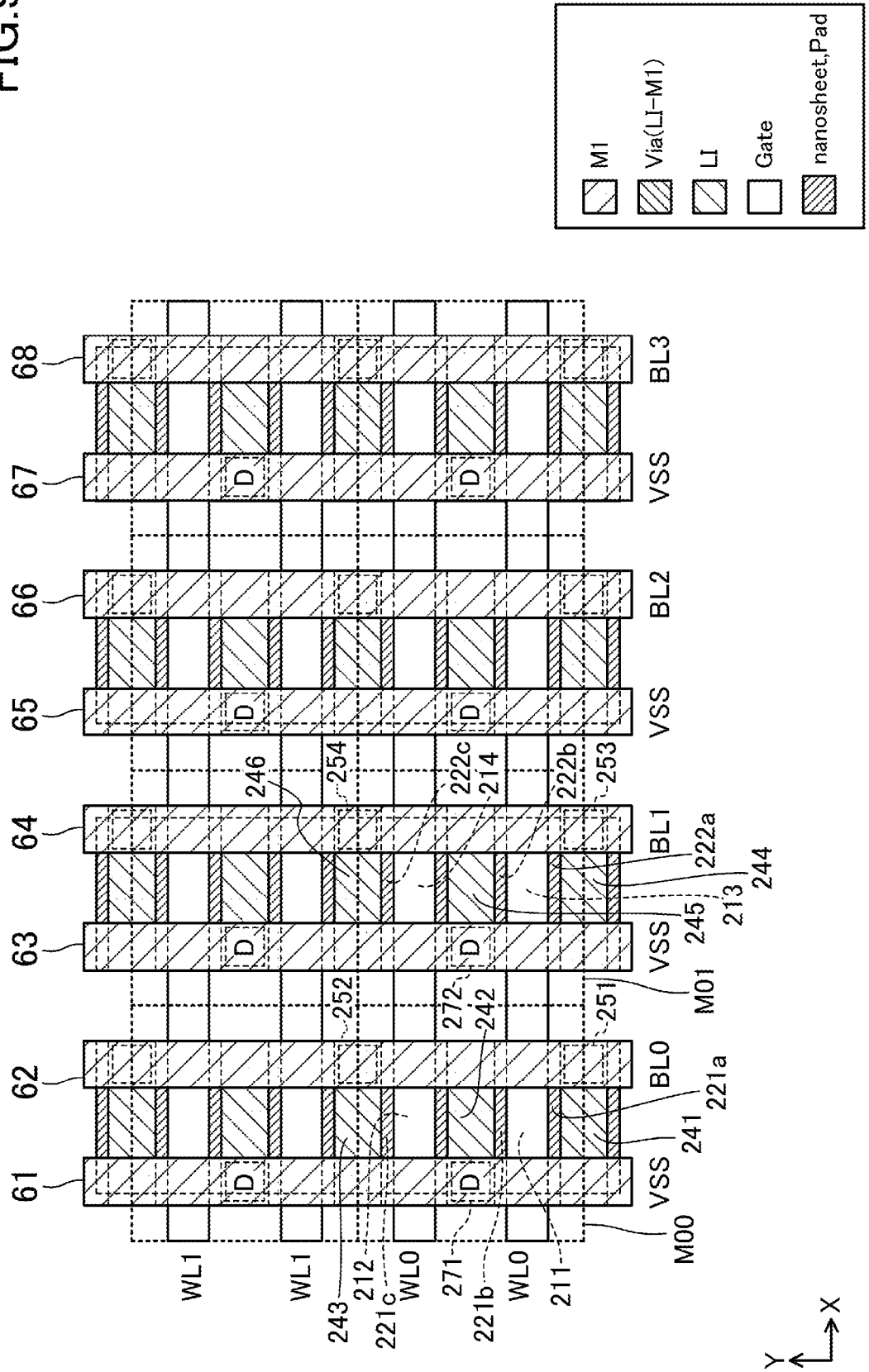
FIG. 9 is a plan view showing an example of the layout structure of a semiconductor storage device according to Alteration 4 of the first embodiment.

FIG. 9 is a plan view of a memory cell array according to Alteration 4 of the first embodiment. In this alteration, each memory cell includes two forksheet FETs that are arranged adjacently in the Y direction and share the source. The structure of memory cells will be described hereinafter taking memory cells M00 and M01 as an example. Note that, since the cross-sectional structure is similar to that in the first embodiment, illustration of the cross sections is omitted here.

The memory cell M00 has nanosheets 211 and 212, each composed of three sheets, as the channel portions. The memory cell M01 has nanosheets 213 and 214, each composed of three sheets, as the channel portions.

A pad 221a, which is a semiconductor layer of integral structure connected to the three sheets, is formed on the lower side of the nanosheets 211 in the figure. A pad 221b, which is a semiconductor layer of integral structure connected to the three sheets, is formed between the nanosheets 211 and 212. A pad 221c, which is a semiconductor layer of integral structure connected to the three sheets, is formed on the upper side of the nanosheets 212 in the figure. The pads 221a and 221c are to be the drain regions of the memory cell M00, and the pad 221b is to be the source region of the memory cell M00.

A pad 222a, which is a semiconductor layer of integral structure connected to the three sheets, is formed on the lower side of the nanosheets 213 in the figure. A pad 222b, which is a semiconductor layer of integral structure connected to the three sheets, is formed between the nanosheets 213 and 214. A pad 222c, which is a semiconductor layer of integral structure connected to the three sheets, is formed on the upper side of the nanosheets 214 in the figure. The pads 222a and 222c are to be the drain regions of the memory cell M01, and the pad 222b is to be the source region of the memory cell M01.

Local interconnects 241, 242, 243, 244, 245, and 246 extending in the X direction are formed. The local interconnect 241 is connected with the pad 221a, the local interconnect 242 is connected with the pad 221b, and the local interconnect 243 is connected with the pad 221c. The local interconnect 244 is connected with the pad 222a, the local interconnect 245 is connected with the pad 222b, and the local interconnect 246 is connected with the pad 222c. The local interconnect 241 is connected with the M1 interconnect 62 through a contact 251, and the local interconnect 243 is connected with the M1 interconnect 62 through a contact 252. The local interconnect 244 is connected with the M1 interconnect 64 through a contact 253, and the local interconnect 246 is connected with the M1 interconnect 64 through a contact 254.

Contacts 271 and 272 determine the memory values of the memory cells by their presence or absence. The contact 271 connects the local interconnect 242 and the M1 interconnect 61 supplying VSS when it is formed, and the contact 272 connects the local interconnect 245 and the M1 interconnect 63 supplying VSS when it is formed.

The faces of the nanosheets 211 on the side closer to the nanosheets 213 in the X direction are exposed, not covered with a gate interconnect. The faces of the nanosheets 213 on the side closer to the nanosheets 211 in the X direction are exposed, not covered with a gate interconnect. The faces of the nanosheets 212 on the side closer to the nanosheets 214 in the X direction are exposed, not covered with a gate interconnect. The faces of the nanosheets 214 on the side closer to the nanosheets 212 in the X direction are exposed, not covered with a gate interconnect.

With the above configuration, since the space required between the nanosheets 211, 212 and the nanosheets 213, 214 is reduced, the distance between the nanosheets 211, 212 and the nanosheets 213, 214 can be reduced. It is therefore possible to achieve reduction in the area of the semiconductor storage device having forksheet FETs.

Also, similar effects regarding the bit lines BL to those described in the first embodiment can also be obtained.

Second Embodiment

In the second embodiment, another example of the layout structure of the mask ROM of FIG. 1 will be described. In this embodiment, nanosheet FETs other than forksheet FETs are used.

Figure 10:
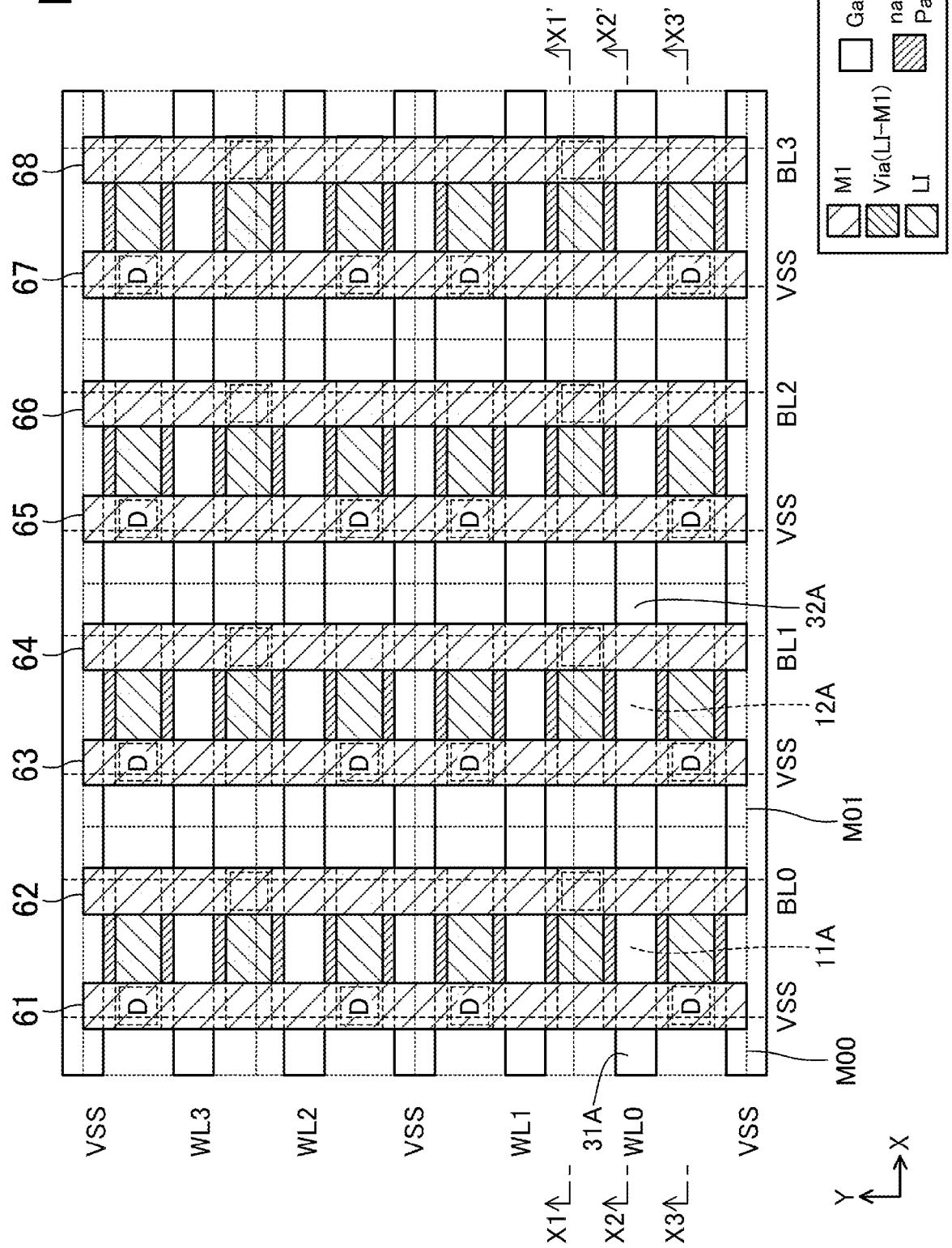
FIG. 10 is a plan view showing an example of the layout structure of a semiconductor storage device according to the second embodiment.

FIGS. 10 and 11A-11C are views showing an example of the layout structure of a mask ROM according to the second embodiment. Specifically, FIG. 10 is a plan view of a memory cell array, and FIGS. 11A-11C are cross-sectional views of the memory cell array of FIG. 10 taken horizontally as viewed in plan, where FIG. 11A shows a cross section taken along line X1-X1', FIG. 11B shows a cross section taken along line X2-X2', and FIG. 11C shows a cross section taken along line X3-X3'.

As in FIG. 2 shown in the first embodiment, FIG. 10 corresponds to the layout of (4×4) bits, and the dotted lines define the bounds of the individual bits. That is, FIG. 10 shows a configuration of an array of memory cells, four arranged in the X direction and four in the Y direction. The memory cells are inverted in the Y direction every other row in the Y direction. The two leftmost memory cells in the lowermost row correspond to the memory cells M00 and M01 in the circuit diagram of FIG. 1, for example.

In FIGS. 10 and 11A-11C, common components with FIGS. 2 and 3A-3C are denoted by the same reference characters, and detailed description thereof is omitted here in some cases.

The memory cells M00 and M01 have nanosheets 11A and 12A, respectively, each composed of three sheets, as the channel portions. That is, the memory cells M00 and M01 each include a nanosheet FET. The faces of the nanosheets 11A on both sides in the X direction are covered with a gate interconnect 31A, and the faces of the nanosheets 12A on both sides in the X direction are covered with a gate interconnect 32A. Therefore, the spacing between the nanosheets 11A and 12A is the same as the spacing between other nanosheets (d3).

The M1 interconnects 61 to 68 extending in the Y direction are arranged at equal spacing, and the M1 interconnects 62, 64, 66, and 68 corresponding to the bit lines BL0 to BL3 are individually interposed between the M1 interconnects 61, 63, 65, and 67 supplying VSS. With the bit lines BL each interposed between VSS lines, crosstalk between the bit lines BL can be prevented, whereby occurrence of a malfunction can be prevented or reduced. Also, since the distances from a bit line BL to its adjacent VSS lines on both sides are the same among all the bit lines BL, the load capacitance due to wiring capacitance related to the bit line BL becomes uniform. This prevents or reduces variations in performance, such as the operating speed, among the bit lines BL.

Moreover, since the positions of the bit lines BL with respect to the nanosheets are uniform, the characteristics of the bit lines BL can be made uniform.

<Alteration 1>

Figure 12:
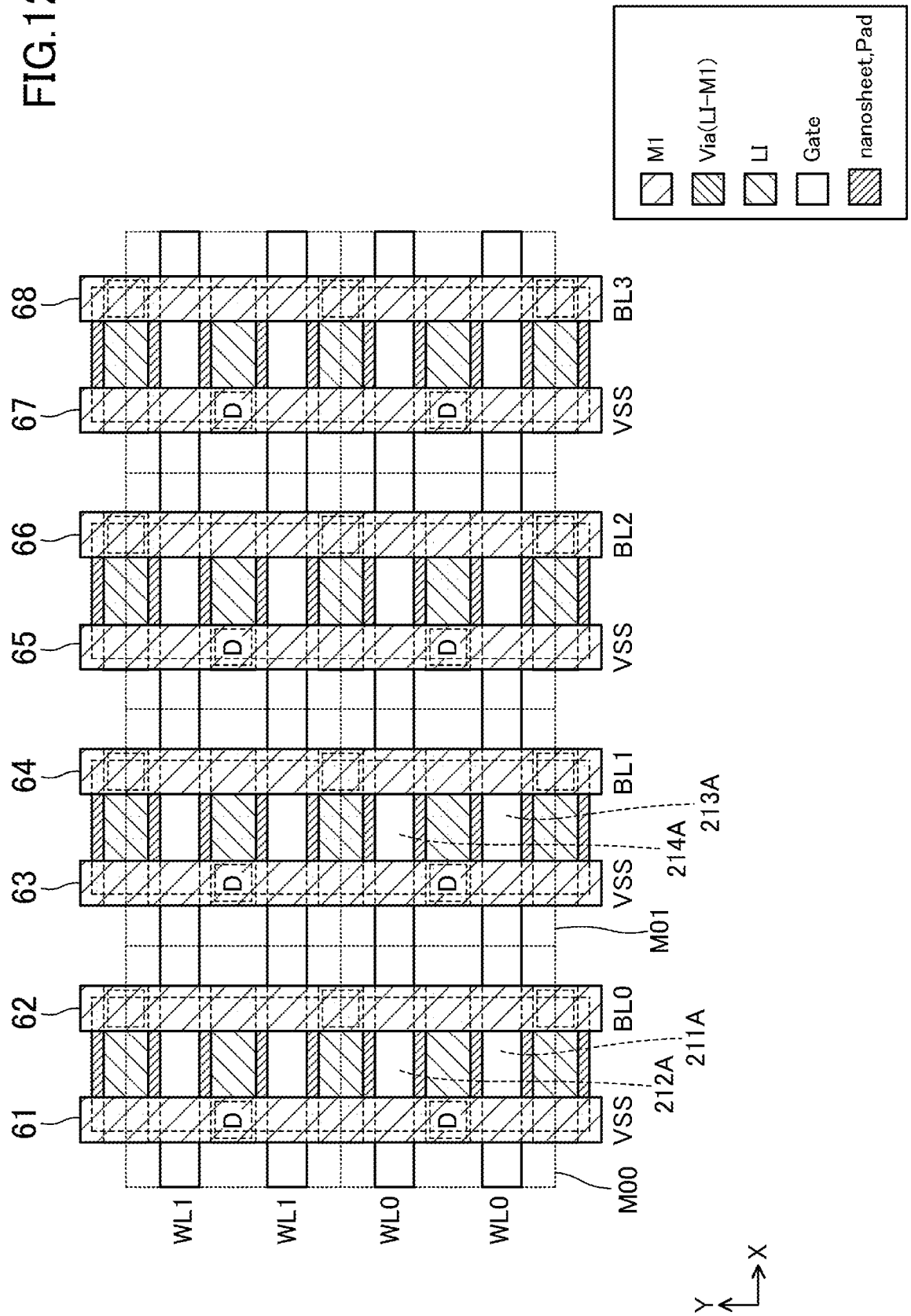
FIG. 12 is a plan view showing an example of the layout structure of a semiconductor storage device according to Alteration 1 of the second embodiment.

FIG. 12 is a plan view of a memory cell array according to Alteration 1 of the second embodiment. In this alteration, as in Alteration 4 of the first embodiment, each memory cell includes two parallel-connected nanosheet FETs arranged side by side in the Y direction.

Note that detailed description of configurations similar to those in Alteration 4 of the first embodiment is omitted here in some cases.

The memory cell M00 has nanosheets 211A and 212A, each composed of three sheets, as the channel portions. The memory cell M01 has nanosheets 213A and 214A, each composed of three sheets, as the channel portions. The faces of the nanosheets 211A, 212A, 213A, and 214A on both sides in the X direction are covered with their respective gate interconnects. Therefore, the spacing between the nanosheets 211A and 213A and the spacing between the nanosheets 212A and 214A are the same as the spacing between other nanosheets.

Also, similar effects regarding the bit lines BL to those described in the second embodiment can be obtained.

Third Embodiment

Figure 13:
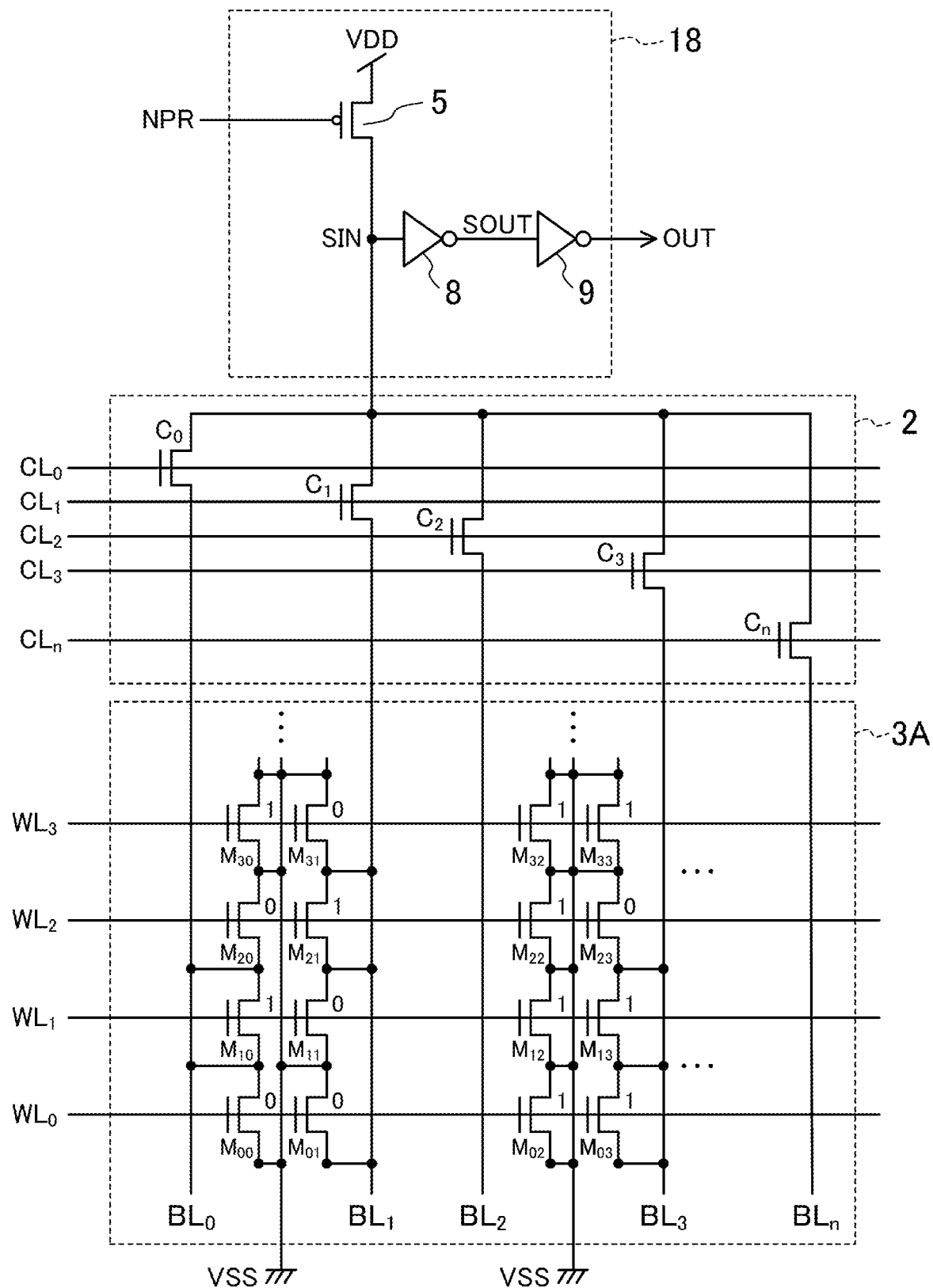
FIG. 13 is a circuit diagram showing a configuration of a contact-type mask ROM as an example of semiconductor storage devices.

FIG. 13 is a circuit diagram showing a configuration of a mask ROM as an example of semiconductor storage devices. The mask ROM of FIG. 13 is a ROM in which whether the source and drain of a memory cell transistor are connected to a same line, or different lines, out of a bit line and a ground power supply line is made to correspond to "1" or "0" of memory data.

In FIG. 13, the mask ROM includes a memory cell array 3A, a column decoder 2, and a sense amplifier 18.

The memory cell array 3A is constituted by memory cells Mij (i=0 to m, j=0 to n) of n-type MOS transistors arranged in a matrix. The gates of the memory cells Mij are connected to corresponding word lines WLi that are common for each row. The sources and drains of the memory cells Mij are connected to corresponding bit lines BLj or the ground power supply line VSS. When the memory data of a memory cell Mij is intended to be "0," one of the source and the drain is connected to a bit line BLj and the other is connected to the ground power supply line VSS. By contrast, when the memory data of a memory cell Mij is intended to be "1," both the source and the drain are connected to a bit line BLj or the ground power supply line VSS.

The column decoder 2 is constituted by n-type MOS transistors Cj. The drains of the n-type MOS transistors Cj are all connected together as a common drain, the gates thereof are connected to corresponding column selection signal lines CLj, and the sources thereof are connected to the corresponding bit lines BLj.

The sense amplifier 18 includes a precharge p-type MOS transistor 5, an inverter 8 that determines the output data of the memory cells Mij, and an inverter 9 that buffers the output signal of the inverter 8. A precharge signal NPR is input into the gate of the p-type MOS transistor 5, the power supply voltage VDD is supplied to the source thereof, and the drain thereof is connected to the common drain of the n-type MOS transistors Cj. The inverter 8, receiving a signal SIN of the common drain of the n-type MOS transistors Cj, determines the output data of the memory cells Mij. The inverter 9, receiving an output signal SOUT of the inverter 8, outputs memory data of the memory cells Mij.

The operation of the mask ROM of FIG. 13 will be described taking as an example the case of reading data of memory cells M00 and M10.

First, among the column selection signal lines CLj, CL0 is made high and the other CL1 to CLn are made low. This turns on C0, among the transistors constituting the column decoder 2, and turns off the other C1 to Cn. Also, the word line WL0 is changed from a low level as the non-selected state to a high level as the selected state.

The precharge signal NPR is then changed from high to low, to turn on the precharge p-type MOS transistor 5.

In the memory cell M00, one of the source and the drain is connected to a bit line BL0 and the other is connected to the ground power supply line VSS. Therefore, since a current flows from the bit line BL0 to the ground power supply line VSS through the memory cell M00, the input signal SIN of the inverter 8 becomes lower in voltage than the switching level of the inverter 8. Thus, the output signal SOUT of the inverter 8 keeps high, and an output signal OUT of the inverter 9 keeps low.

In the case of reading data of the memory cell M10, the word line WL1 is changed from the low level as the non-selected state to the high level as the selected state.

In the memory cell M10, both the source and the drain are connected to the bit line BL0. Therefore, since no current flows to the bit line BL0, the input signal SIN of the inverter 8 becomes higher in voltage than the switching level of the inverter 8. Thus, the output signal SOUT of the inverter 8 becomes low, and the output signal OUT of the inverter 9 becomes high.

That is, when one of the source and drain of a memory cell is connected to a bit line and the other is connected to the ground power supply line, a low level is output (memory data "0"), and when both the source and drain of a memory cell are connected to a bit line or the ground power supply line, a high level is output (memory data "1").

Figure 14:
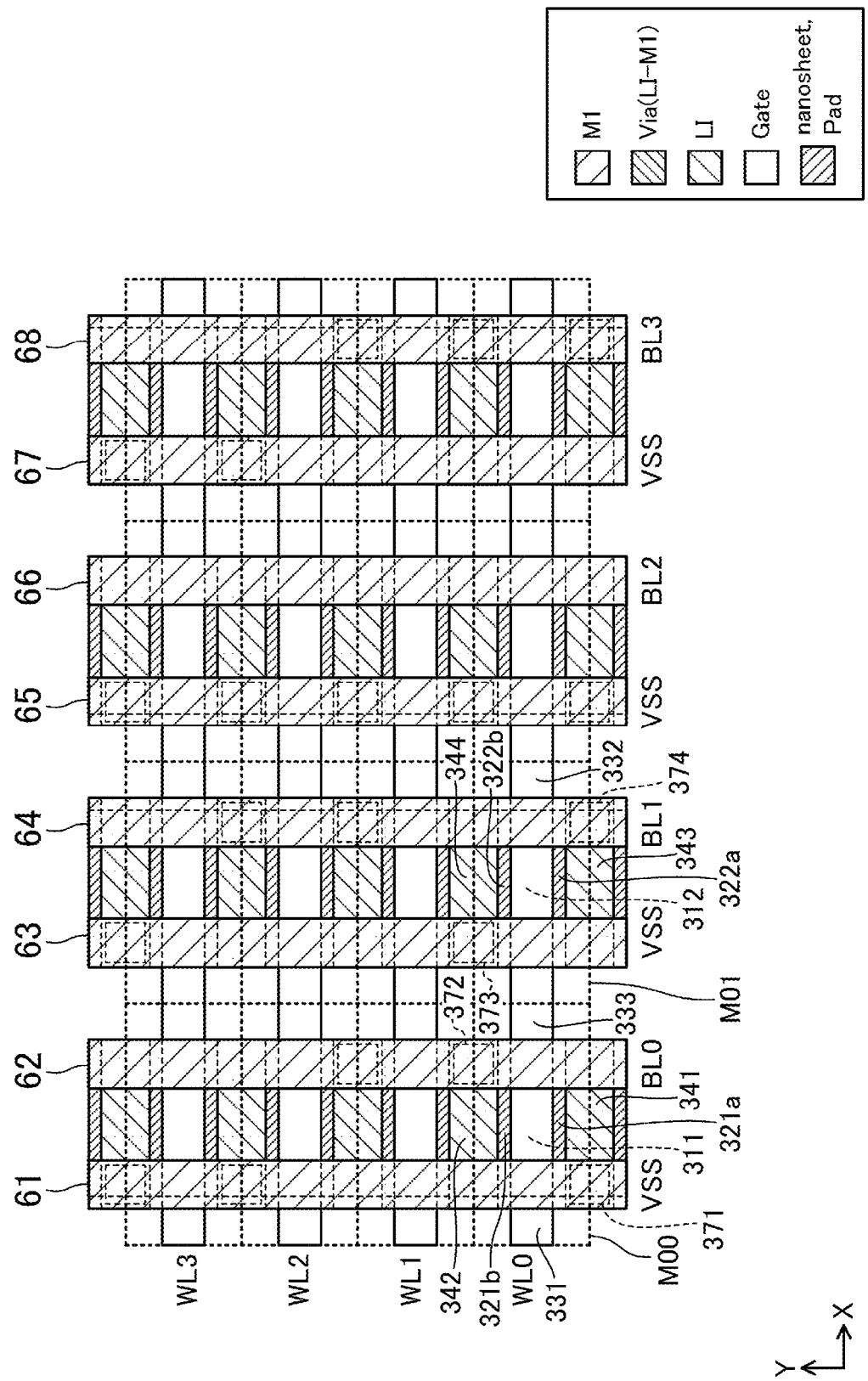
FIG. 14 is a plan view showing an example of the layout structure of a semiconductor storage device according to the third embodiment.

FIG. 14 is a plan view showing an example of the layout structure of a mask ROM according to the third embodiment. FIG. 14 corresponds to the layout of (4×4) bits, and the dotted lines define the bounds of the individual bits. That is, FIG. 14 shows a configuration of an array of memory cells, four arranged in the X direction and four in the Y direction. The two leftmost memory cells in the lowermost row correspond to the memory cells M00 and M01 in the circuit diagram of FIG. 13, for example.

The configuration of FIG. 14 is basically similar to the configuration of FIG. 2 shown in the first embodiment. There are however differences in the positions of contacts, etc. according to the difference in the circuit structure of the mask ROM. Also, no dummy gate interconnects supplying VSS are provided. Note that description of configurations similar to those in the first embodiment is omitted here in some cases. Also, since the cross-sectional structure is similar to that of FIGS. 3A-3C, illustration of cross sections is omitted here.

The memory cells M00 and M01 have nanosheets 311 and 312, respectively, each composed of three sheets, as the channel portions. That is, the memory cells M00 and M01 each include a nanosheet FET. The nanosheets 311 and 312 are opposed to each other in the X direction.

In FIG. 14, pads 321a and 322a, each of which is a semiconductor layer of integral structure connected to the three sheets, are formed on the lower sides of the nanosheets 311 and 312, respectively, in the figure. Pads 321b and 322b, each of which is a semiconductor layer of integral structure connected to the three sheets, are formed on the upper sides of the nanosheets 311 and 312, respectively, in the figure. The pads 321a and 321b are to be the nodes of the memory cell M00, and the pads 322a and 322b are to be the nodes of the memory cell M01.

Gate interconnects 331 and 332 extending in the X direction are formed. The gate interconnect 331 surrounds the peripheries of the nanosheets 311 of the memory cell M00 in the X and Z directions via a gate insulating film. The gate interconnect 331 is to be the gate of the memory cell M00. The gate interconnect 332 surrounds the peripheries of the nanosheets 312 of the memory cell M01 in the X and Z directions via a gate insulating film. The gate interconnect 332 is to be the gate of the memory cell M01. The gate interconnects 331 and 332 are connected with other gate interconnects arranged in line in the X direction, to constitute a word line WL0. That is, word lines WL0 to WL3 each include gate interconnects arranged in line in the X direction.

Local interconnects 341, 342, 343, and 344 extending in the X direction are formed. The local interconnect 341 is connected with the pad 321a, and the local interconnect 342 is connected with the pad 321b. The local interconnect 343 is connected with the pad 322a, and the local interconnect 344 is connected with the pad 322b.

Contacts 371, 372, 373, and 374 determine the memory values of the memory cells by their locations. That is, each of the memory cells M00 and M01 has memory data "1" when both nodes are connected to VSS through contacts or to a bit line BL through contacts. By contrast, each of the memory cells M00 and M01 has memory data "0" when one of the nodes is connected to VSS through a contact and the other node is connected to a bit line BL through a contact.

In the configuration of FIG. 14, the memory cell M00 has memory data "0" since one of its nodes is connected to the M1 interconnect 61 supplying VSS through the contact 371 and the other node is connected to the M1 interconnect 62 corresponding to the bit line BL0 through the contact 372. The memory cell M01 has memory data "0" since one of its nodes is connected to the M1 interconnect 63 supplying VSS through the contact 373 and the other node is connected to the M1 interconnect 64 corresponding to the bit line BL1 through the contact 374.

Note here that the faces of the nanosheets 311 on the side closer to the nanosheets 312 in the X direction are exposed, not covered with the gate interconnect 331. Also, the faces of the nanosheets 312 on the side closer to the nanosheets 311 in the X direction are exposed, not covered with the gate interconnect 332. That is, the memory cells M00 and M01 each include a forksheet FET. Note that the gate interconnects 331 and 332 are mutually connected through a bridge 333 formed between the gate interconnects 331 and 332. The bridge 333 is an example of the gate connecting unit.

With the above configuration, since the space required between the nanosheets 311 and 312 is reduced, the distance between the nanosheets 311 and 312 can be reduced. It is therefore possible to achieve reduction in the area of the semiconductor storage device having forksheet FETs.

As described above, in this embodiment, the semiconductor storage device includes the ROM cells M00 and M01 adjacent to each other in the X direction. The ROM cell M00, provided between the bit line 62 and the ground power supply line 61, includes a nanosheet FET having the nanosheets 311 as the channel region. The ROM cell M01, provided between the bit line 64 and the ground power supply line 63, includes a nanosheet FET having the nanosheets 312 as the channel region. The nanosheets 311 and 312 are opposed to each other in the X direction, where the faces of the nanosheets 311 closer to the nanosheets 312 are exposed from the gate interconnect 331, and the faces of the nanosheets 312 closer to the nanosheets 311 are exposed from the gate interconnect 332. This can reduce the distance between the nanosheets 311 and 312, thereby permitting reduction in the area of the semiconductor storage device.

The M1 interconnects 61 to 68 extending in the Y direction are arranged at equal spacing, and the M1 interconnects 62, 64, 66, and 68 corresponding to the bit lines BL0 to BL3 are individually interposed between the M1 interconnects 61, 63, 65, and 67 supplying VSS. With the bit lines BL each interposed between VSS lines, crosstalk between the bit lines BL can be prevented, whereby occurrence of a malfunction can be prevented. Also, since the distances from a bit line BL to its adjacent VSS lines on both sides are the same among all the bit lines BL, the load capacitance due to wiring capacitance related to the bit line BL becomes uniform. This prevents or reduces variations in performance, such as the operating speed, among the bit lines BL.

It is not necessarily required to arrange the M1 interconnects 61 to 68 extending in the Y direction at equal spacing. In such a case, also, if only the distances from a bit line BL to its adjacent VSS lines on both sides are the same among all the bit lines BL, the load capacitance due to wiring capacitance related to the bit line BL will become uniform, and thus variations in performance, such as the operating speed, among the bit lines BL will be prevented or reduced.

For example, even when all of the M1 interconnects 61, 63, 65, and 67 supplying VSS are displaced by a same distance in the X direction, the load capacitance due to wiring capacitance related to each bit line BL will be uniform, and thus variations in performance, such as the operating speed, among the bit lines BL will be prevented or reduced.

<Alteration 1>

Figure 15:
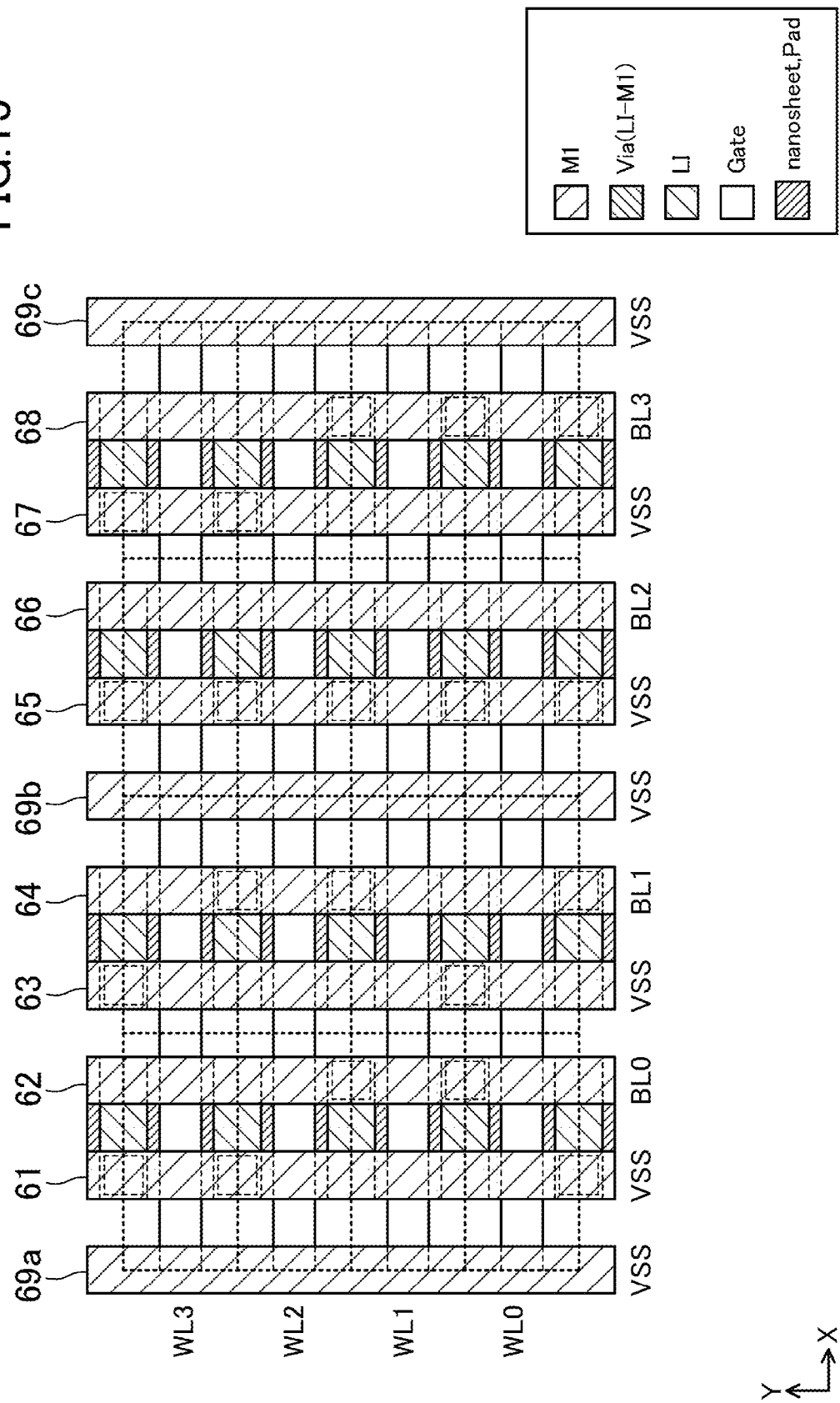
FIG. 15 is a plan view showing an example of the layout structure of a semiconductor storage device according to Alteration 1 of the third embodiment.

FIG. 15 is a plan view of a memory cell array according to Alteration 1 of the third embodiment. The layout structure of FIG. 15 is basically similar to the layout structure of FIG. 14, except that, in FIG. 15, as in Alteration 1 of the first embodiment, the positions of the M1 interconnects 62, 64, 66, and 68 corresponding to the bit lines BL0 to BL3 with respect to the nanosheets are uniform. Also, the positions of the M1 interconnects 61, 63, 65, and 67 supplying VSS with respect to the nanosheets are uniform. With these changes in the positioning of the M1 interconnects 61 to 68, the positions of the contacts and the lengths of the local interconnects are different from those in FIG. 14.

Also, M1 interconnects 69a, 69b, and 69c supplying VSS are additionally provided in the space produced by the uniform positioning of the bit lines BL with respect to the nanosheets. With this additional placement, since the distances from a bit line BL to its adjacent VSS lines on both sides can be made uniform for all the bit lines BL, the load capacitance related to the bit line BL can be made uniform. Note that it is not necessarily required to additionally provide the M1 interconnects 69a, 69b, and 69c supplying VSS.

Also, as in the configuration of FIG. 5, a wide M1 interconnect may be placed in place of two adjacent M1 interconnects supplying VSS.

<Alteration 2>

Figure 16:
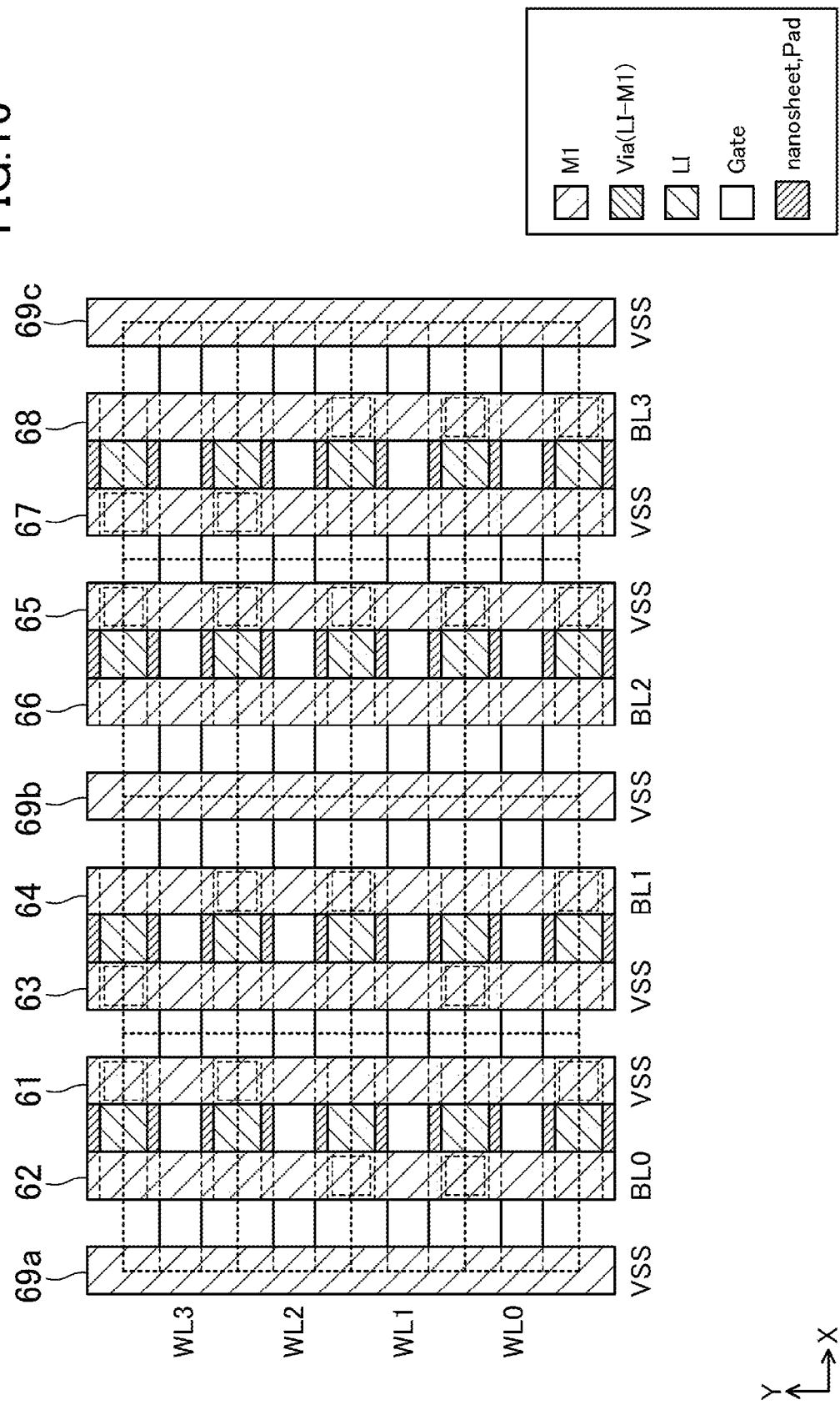
FIG. 16 is a plan view showing an example of the layout structure of a semiconductor storage device according to Alteration 2 of the third embodiment.

FIG. 16 is a plan view of a memory cell array according to Alteration 2 of the third embodiment. The layout structure of FIG. 16 is substantially similar to the layout structure of FIG. 15, except that, in FIG. 16, the positions of the M1 interconnects 61 and 62 are interchanged, and the positions of the M1 interconnects 65 and 66 are interchanged, as in Alteration 2 of the first embodiment. This makes uniform the positions of the bit lines BL with respect to the exposed portions of the forksheets from the gate interconnects. That is, all of the M1 interconnects 62, 64, 66, and 68 corresponding to the bit lines BL0 to BL3 are located on the side opposite to the side on which the forksheets are exposed from the gate interconnects. This can make the characteristics of the bit lines BL further uniform.

<Alteration 3>

Figure 17:
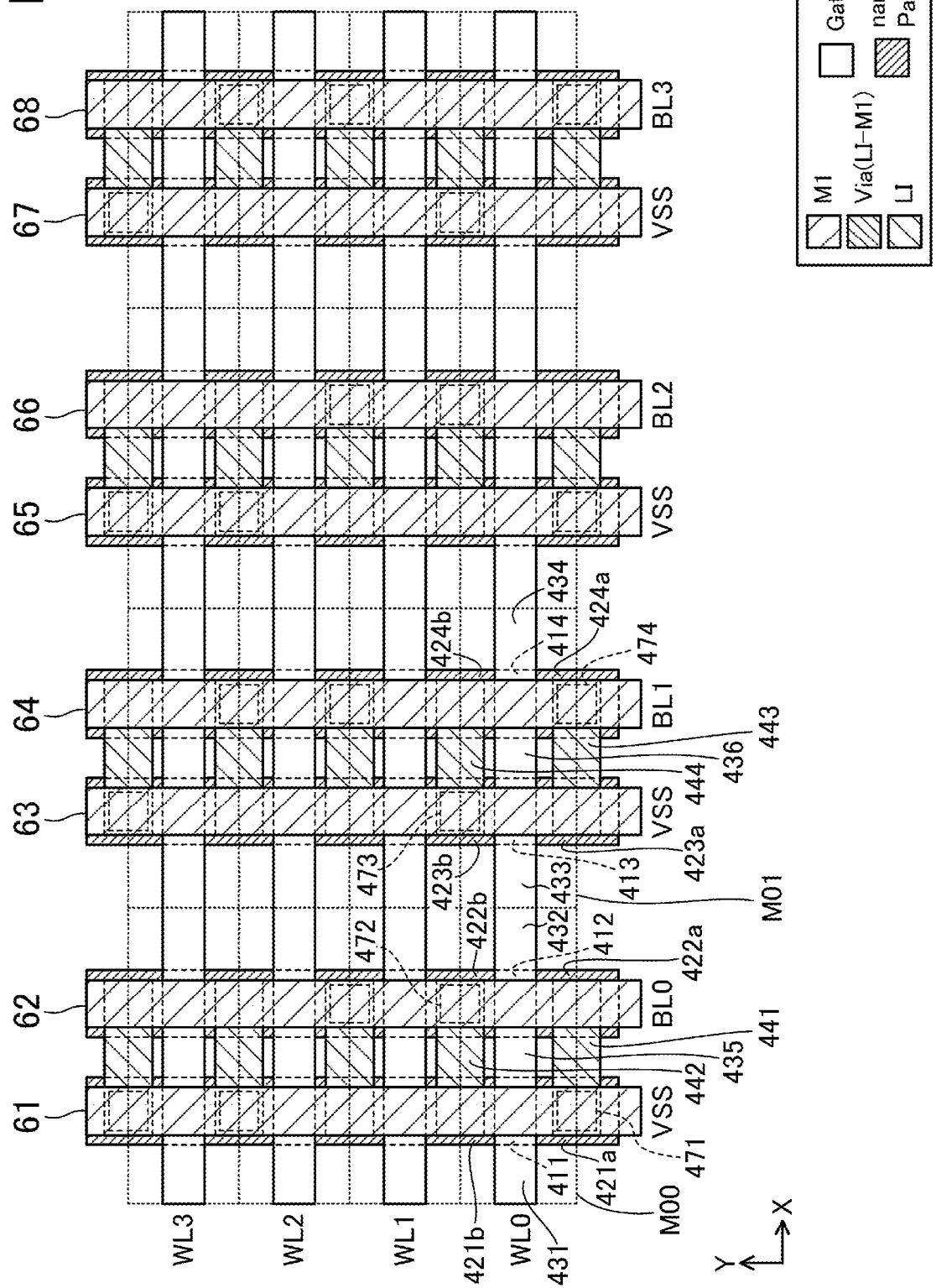
FIG. 17 is a plan view showing an example of the layout structure of a semiconductor storage device according to Alteration 3 of the third embodiment.

FIG. 17 is a plan view of a memory cell array according to Alteration 3 of the third embodiment. In this alteration, as in Alteration 3 of the first embodiment, a memory cell of each bit includes two parallel-connected forksheet FETs arranged side by side in the X direction. The structure of memory cells will be described hereinafter taking memory cells M00 and M01 as an example.

The memory cell M00 has nanosheets 411 and 412, each composed of three sheets, as the channel portions. The memory cell M01 has nanosheets 413 and 414, each composed of three sheets, as the channel portions.

In FIG. 17, pads 421a and 422a, each of which is a semiconductor layer of integral structure connected to the three sheets, are formed on the lower sides of the nanosheets 411 and 412, respectively, in the figure. Pads 421b and 422b, each of which is a semiconductor layer of integral structure connected to the three sheets, are formed on the upper sides of the nanosheets 411 and 412, respectively, in the figure. The pads 421a, 421b, 422a, and 422b are to be the nodes of the memory cell M00. Also, pads 423a and 424a, each of which is a semiconductor layer of integral structure connected to the three sheets, are formed on the lower sides of the nanosheets 413 and 414, respectively, in the figure. Pads 423b and 424b, each of which is a semiconductor layer of integral structure connected to the three sheets, are formed on the upper sides of the nanosheets 413 and 414, respectively, in the figure. The pads 423a, 423b, 424a, and 424b are to be the nodes of the memory cell M01.

Gate interconnects 431, 432, 433, and 434 extending in the X direction are formed.

The gate interconnect 431 surrounds the peripheries of the nanosheets 411 of the memory cell M00 in the X and Z directions via a gate insulating film (not shown), and the gate interconnect 432 surrounds the peripheries of the nanosheets 412 of the memory cell M00 in the X and Z directions via a gate insulating film (not shown). The gate interconnects 431 and 432 are to be the gates of the memory cell M00. Also, the gate interconnect 433 surrounds the peripheries of the nanosheets 413 of the memory cell M01 in the X and Z directions via a gate insulating film (not shown), and the gate interconnect 434 surrounds the peripheries of the nanosheets 414 of the memory cell M01 in the X and Z directions via a gate insulating film (not shown). The gate interconnects 433 and 434 are to be the gates of the memory cell M01.

Note here that the faces of the nanosheets 411 on the side closer to the nanosheets 412 in the X direction are exposed, not covered with the gate interconnect 431. The faces of the nanosheets 412 on the side closer to the nanosheets 411 in the X direction are exposed, not covered with the gate interconnect 432. The faces of the nanosheets 413 on the side closer to the nanosheets 414 in the X direction are exposed, not covered with the gate interconnect 433. The faces of the nanosheets 414 on the side closer to the nanosheets 413 in the X direction are exposed, not covered with the gate interconnect 434.

With the above configuration, since the space required between the nanosheets 411 and 412 is reduced, the distance between the nanosheets 411 and 412 can be reduced. Similarly, since the space required between the nanosheets 413 and 414 is reduced, the distance between the nanosheets 413 and 414 can be reduced.

Note that the gate interconnects 431 and 432 are mutually connected through a bridge 435 formed between the gate interconnects 431 and 432. Also, the gate interconnects 433 and 434 are mutually connected through a bridge 436 formed between the gate interconnects 433 and 434. The bridges 435 and 436 are an example of the gate connecting unit.

Local interconnects 441, 442, 443, and 444 extending in the X direction are formed. The local interconnect 441 is connected with the pads 421a and 422a, and the local interconnect 442 is connected with the pads 421b and 422b. That is, the drains of the two nanosheet FETs of the memory cell M00 are mutually connected, and the sources thereof are mutually connected. Also, the local interconnect 443 is connected with the pads 423a and 424a, and the local interconnect 444 is connected with the pads 423b and 424b. That is, the drains of the two nanosheet FETs of the memory cell M01 are mutually connected, and the sources thereof are mutually connected.

Contacts 471, 472, 473, and 474 determine the memory values of the memory cells by their locations. That is, each of the memory cells M00 and M01 has memory data "1" when both nodes are connected to VSS through contacts or to a bit line BL through contacts. By contrast, each of the memory cells M00 and M01 has memory data "0" when one of the nodes is connected to VSS through a contact and the other node is connected to a bit line BL through a contact.

In the configuration of FIG. 17, the memory cell M00 has memory data "0" since one of its nodes is connected to the M1 interconnect 61 supplying VSS through the contact 471 and the other node is connected to the M1 interconnect 62 corresponding to the bit line BL0 through the contact 472. The memory cell M01 has memory data "0" since one of its nodes is connected to the M1 interconnect 63 supplying VSS through the contact 473 and the other node is connected to the M1 interconnect 64 corresponding to the bit line BL1 through the contact 474.

As described above, in this alteration, the semiconductor storage device includes the ROM cell M00. The ROM cell M00 includes: the first nanosheet FET having the nanosheets 411 as the channel region, provided between the bit line 62 and the ground power supply line 61; and the second nanosheet FET having the nanosheets 412 as the channel region, provided between the bit line 62 and the ground power supply line 61. The nanosheets 411 and 412 are opposed to each other in the X direction, where the faces of the nanosheets 411 closer to the nanosheets 412 in the X direction are exposed from the gate interconnect 431, and the faces of the nanosheets 412 closer to the nanosheets 411 in the X direction are exposed from the gate interconnect 432. This can reduce the spacing between the nanosheets 411 and 412, and thus reduce the size of the ROM cell M00 in the X direction, thereby permitting reduction in the area of the semiconductor storage device. On the other hand, since the spacing between adjacent ROM cells in the X direction can be widened, isolation of local interconnects from each other becomes easy, whereby the manufacture easiness of the semiconductor storage device improves.

With the bit lines BL each interposed between VSS lines, crosstalk between the bit lines BL can be prevented, whereby occurrence of a malfunction can be prevented. Also, since the distances from a bit line BL to its adjacent VSS lines on both sides are the same among all the bit lines BL, the load capacitance due to wiring capacitance related to the bit line BL becomes uniform. This prevents or reduces variations in performance, such as the operating speed, among the bit lines BL. Moreover, since the positions of the bit lines BL with respect to the nanosheets are uniform, the characteristics of the bit lines BL can be made uniform.

Fourth Embodiment

In the fourth embodiment, another example of the layout structure of the mask ROM in FIG. 13 will be described. In this embodiment, nanosheet FETs other than forksheet FETs are used.

Figure 18:
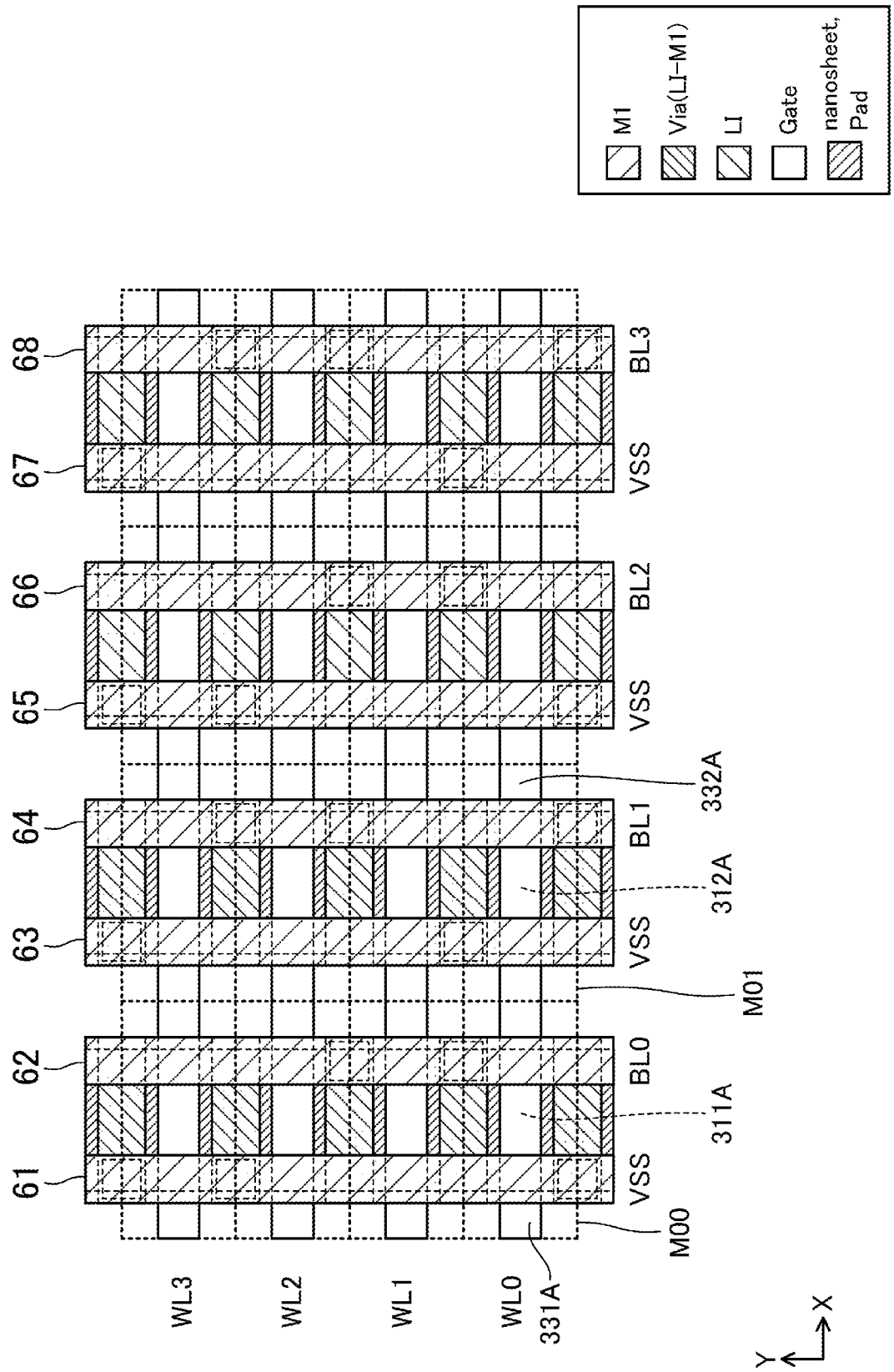
FIG. 18 is a plan view showing an example of the layout structure of a semiconductor storage device according to the fourth embodiment.

FIG. 18 is a plan view showing an example of the layout structure of a mask ROM according to the fourth embodiment. FIG. 18 corresponds to the layout of (4×4) bits, and the dotted lines define the bounds of the individual bits. That is, FIG. 18 shows a configuration of an array of memory cells, four arranged in the X direction and four in the Y direction. The two leftmost memory cells in the lowermost row correspond to the memory cells M00 and M01 in the circuit diagram of FIG. 13, for example.

The memory cells M00 and M01 have nanosheets 311A and 312A, respectively, each composed of three sheets, as the channel portions. That is, the memory cells M00 and M01 each include a nanosheet FET. The faces of the nanosheets 311A on both sides in the X direction are covered with a gate interconnect 331A, and the faces of the nanosheets 312A on both sides in the X direction are covered with a gate interconnect 332A. Therefore, the spacing between the nanosheets 311A and 312A is the same as the spacing between other nanosheets.

The M1 interconnects 61 to 68 extending in the Y direction are arranged at equal spacing, and the M1 interconnects 62, 64, 66, and 68 corresponding to the bit lines BL0 to BL3 are individually interposed between the M1 interconnects 61, 63, 65, and 67 supplying VSS. With the bit lines BL each interposed between VSS lines, crosstalk between the bit lines BL can be prevented, whereby occurrence of a malfunction can be prevented. Also, since the distances from a bit line BL to its adjacent VSS lines on both sides are the same among all the bit lines BL, the load capacitance due to wiring capacitance related to the bit line BL becomes uniform. This prevents or reduces variations in performance, such as the operating speed, among the bit lines BL.

Moreover, since the positions of the bit lines BL with respect to the nanosheets are uniform, the characteristics of the bit lines BL can be made uniform.

While each channel portion has a stacked structure of three nanosheets in the embodiments and alterations described above, it is not limited to this. Some or all of the channel portions may include one nanosheet, or a stacked structure of two, four, or more nanosheets.

Also, while the cross-sectional shape of the nanosheets is illustrated as rectangular in the above embodiments, it is not limited to this. For example, the shape may be square, circular, or oval.

According to the present disclosure, a small-area layout structure can be implemented for a semiconductor storage device using forksheet FETs. The present disclosure is therefore useful for downsizing, and improvement in the integration scale, of semiconductor chips, for example.

What is claimed is:

1. A semiconductor storage device including first and second read only memory (ROM) cells adjacent to each other in a first direction, comprising:
   a word line extending in the first direction;
   first and second bit lines extending in a second direction perpendicular to the first direction; and
   first and second ground power supply lines extending in the second direction, wherein;
   the first ROM cell includes
      a first nanosheet field effect transistor (FET) having a first nanosheet as a channel region, provided between the first bit line and the first ground power supply line, the first nanosheet including a stacked structure of a plurality of nanosheets overlapping each other as viewed in plan in a third direction perpendicular to the first and second directions,
   the second ROM cell includes
      a second nanosheet FET having a second nanosheet as a channel region, provided between the second bit line and the second ground power supply line, the second nanosheet including a stacked structure of a plurality of nanosheets overlapping each other as viewed in plan in the third direction,
   the word line includes a first gate interconnect surrounding peripheries of the first nanosheet in the first direction and the third direction and a second gate interconnect surrounding peripheries of the second nanosheet in the first direction and the third direction,
   the first ROM cell stores first data depending on a connection relationship of nodes of the first nanosheet FET with the first bit line and the first ground power supply line, and the second ROM cell stores second data depending on a connection relationship of nodes of the second nanosheet FET with the second bit line and the second ground power supply line, and
   the first and second nanosheets are opposed to each other in the first direction, a face of the first nanosheet closer to the second nanosheet in the first direction is exposed from the first gate interconnect, and a face of the second nanosheet closer to the first nanosheet in the first direction is exposed from the second gate interconnect.

2. The semiconductor storage device of claim 1, wherein the first and second bit lines and the first and second ground power supply lines are placed at equal spacing in the first direction.

3. The semiconductor storage device of claim 1, wherein the word line includes a gate connecting unit formed between the first gate interconnect and the second gate interconnect for connecting the first and second gate interconnects.

4. The semiconductor storage device of claim 1, wherein the first nanosheet FET includes two nanosheet FETs placed adjacently in the second direction and sharing a source, and
the second nanosheet FET includes two nanosheet FETs placed adjacently in the second direction and sharing a source.

5. The semiconductor storage device of claim 1, wherein the first ROM cell stores the first data depending on presence or absence of connection between a drain of the first nanosheet FET and the first bit line, or presence or absence of connection between a source of the first nanosheet FET and the first ground power supply line, and
the second ROM cell stores the second data depending on presence or absence of connection between a drain of the second nanosheet FET and the second bit line, or presence or absence of connection between a source of the second nanosheet FET and the second ground power supply line.

6. The semiconductor storage device of claim 1, wherein the first ROM cell stores the first data depending on whether a source and drain of the first nanosheet FET are connected to a same line, or different lines, out of the first bit line and the first ground power supply line, and
the second ROM cell stores the second data depending on whether a source and drain of the second nanosheet FET are connected to a same line, or different lines, out of the second bit line and the second ground power supply line.

7. A semiconductor storage device including a read only memory (ROM) cell, comprising:
   a word line extending in a first direction;
   a bit line extending in a second direction perpendicular to the first direction; and
   a ground power supply line extending in the second direction, wherein;
   the ROM cell includes
      a first nanosheet FET having a first nanosheet as a channel region, provided between the bit line and the ground power supply line, the first nanosheet including a stacked structure of a plurality of nanosheets overlapping each other as viewed in plan in a third direction perpendicular to the first and second directions, and
      a second nanosheet FET having a second nanosheet as a channel region, provided between the bit line and the ground power supply line, the second nanosheet including a stacked structure of a plurality of nanosheets overlapping each other as viewed in plan in the third direction, the first and second nanosheet FETs are adjacent to each other in the first direction, their drains being mutually connected and their sources being mutually connected, the word line includes a first gate interconnect surrounding peripheries of the first nanosheet in the first direction and the third direction and a second gate interconnect surrounding peripheries of the second nanosheet in the first direction and the third direction, the ROM cell stores data depending on a connection relationship of nodes of the first and second nanosheet FETs with the bit line and the ground power supply line, and the first and second nanosheets are opposed to each other in the first direction, a face of the first nanosheet closer to the second nanosheet in the first direction is exposed from the first gate interconnect, and a face of the second nanosheet closer to the first nanosheet in the first direction is exposed from the second gate interconnect.

8. The semiconductor storage device of claim 7, wherein the word line includes a gate connecting unit formed between the first gate interconnect and the second gate interconnect for connecting the first and second gate interconnects.

9. The semiconductor storage device of claim 7, wherein the ROM cell stores data depending on presence or absence of connection between the drains of the first and second nanosheet FETs and the bit line, or presence or absence of connection between the sources of the first and second nanosheet FETs and the ground power supply line.

10. The semiconductor storage device of claim 7, wherein the ROM cell stores data depending on whether the sources and drains of the first and second nanosheet FETs are connected to a same line, or different lines, out of the bit line and the ground power supply line.

11. A semiconductor storage device including first and second read only memory (ROM) cells adjacent to each other in a first direction, comprising:
a word line extending in the first direction;
first and second bit lines extending in a second direction perpendicular to the first direction; and
a plurality of ground power supply lines including first and second ground power supply lines extending in the second direction, wherein:
the first ROM cell includes
a first nanosheet FET having a first nanosheet as a channel region, provided between the first bit line and the first ground power supply line, the first nanosheet including a stacked structure of a plurality of nanosheets overlapping each other as viewed in plan in a third direction perpendicular to the first and second directions,
the second ROM cell includes
a second nanosheet FET having a second nanosheet as a channel region, provided between the second bit line and the second ground power supply line, the second nanosheet including a stacked structure of a plurality of nanosheets overlapping each other as viewed in plan in the third direction,
the word line includes a first gate interconnect surrounding peripheries of the first nanosheet in the first direction and the third direction and a second gate interconnect surrounding peripheries of the second nanosheet in the first direction and the third direction, the first ROM cell stores first data depending on a connection relationship of nodes of the first nanosheet FET with the first bit line and the first ground power supply line, and the second ROM cell stores second data depending on a connection relationship of nodes of the second nanosheet FET with the second bit line and the second ground power supply line, a distance between the first bit line and a ground power supply line adjacent on a first-hand side of the first bit line in the first direction is equal to a distance between the second bit line and a ground power supply line adjacent on the first-hand side of the second bit line in the first direction, and a distance between the first bit line and a ground power supply line adjacent on a second-hand side, opposite to the first-hand side, of the first bit line in the first direction is equal to a distance between the second bit line and a ground power supply line adjacent on the second-hand side of the second bit line in the first direction.

12. The semiconductor storage device of claim 11, wherein
the adjacent ground power supply line on the first-hand side of the first bit line in the first direction is the first ground power supply line, and
the adjacent ground power supply line on the first-hand side of the second bit line in the first direction is the second ground power supply line.

13. The semiconductor storage device of claim 11, wherein
the first and second nanosheets are opposed to each other in the first direction, a face of the first nanosheet closer to the second nanosheet in the first direction is exposed from the first gate interconnect, and a face of the second nanosheet closer to the first nanosheet in the first direction is exposed from the second gate interconnect.

14. The semiconductor storage device of claim 11, wherein
the first ROM cell stores the first data depending on presence or absence of connection between a drain of the first nanosheet FET and the first bit line, or presence or absence of connection between a source of the first nanosheet FET and the first ground power supply line, and
the second ROM cell stores the second data depending on presence or absence of connection between a drain of the second nanosheet FET and the second bit line, or presence or absence of connection between a source of the second nanosheet FET and the second ground power supply line.

15. The semiconductor storage device of claim 11, wherein
the first ROM cell stores the first data depending on whether a source and drain of the first nanosheet FET are connected to a same line, or different lines, out of the first bit line and the first ground power supply line, and
the second ROM cell stores the second data depending on whether a source and drain of the second nanosheet FET are connected to a same line, or different lines, out of the second bit line and the second ground power supply line.

* * * * *